US012593573B2

(12) United States Patent     (10) Patent No.: US 12,593,573 B2
Choi et al.     (45) Date of Patent: Mar. 31, 2026

(54) DISPLAY DEVICE COMPRISING A DISPLAY PANEL HAVING INSULATING LAYERS OVER A PAD AND METHOD OF PROVIDING THE DISPLAY PANEL

(71) Applicant: Samsung Display Co., Ltd., Yongin-si (KR)

(72) Inventors: Daewon Choi, Cheonan-si (KR); Daesoo Kim, Seoul (KR); Sanggab Kim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 716 days.

(21) Appl. No.: 17/961,092

(22) Filed: Oct. 6, 2022

(65) Prior Publication Data

US 2023/0189579 A1    Jun. 15, 2023

(30) Foreign Application Priority Data

Dec. 10, 2021    (KR) ......................... 10-2021-0176788

(51) Int. Cl.
| | |
|---|---|
| *H01L 27/32* | (2006.01) |
| *H01L 51/56* | (2006.01) |
| *H10K 59/124* | (2023.01) |
| *H10K 71/00* | (2023.01) |
| *H10K 59/12* | (2023.01) |
| *H10K 59/131* | (2023.01) |

(52) U.S. Cl.
CPC ........... *H10K 59/124* (2023.02); *H10K 71/00* (2023.02); *H10K 59/1201* (2023.02); *H10K 59/131* (2023.02)

(58) Field of Classification Search
CPC ................................................... H10K 59/124
See application file for complete search history.

(56) References Cited

U.S. PATENT DOCUMENTS

| | | | |
|---|---|---|---|
| 9,991,464 | B2 | 6/2018 | Lee et al. |
| 10,361,395 | B2 | 7/2019 | Kajiyama |
| 10,817,088 | B2 | 10/2020 | Yang et al. |
| 11,018,316 | B2 | 5/2021 | Matsuda et al. |
| 11,322,564 | B2 | 5/2022 | Son et al. |
| 11,355,728 | B2 | 6/2022 | Kim et al. |
| 11,951,722 | B2 | 4/2024 | Hwang et al. |

(Continued)

FOREIGN PATENT DOCUMENTS

| | | |
|---|---|---|
| JP | 6817997 B2 | 1/2021 |
| KR | 20080084286 A | 9/2008 |

(Continued)

*Primary Examiner* — Peter Bradford
(74) *Attorney, Agent, or Firm* — CANTOR COLBURN LLP

(57) ABSTRACT

A display device includes a display panel including a display area, a non-display area adjacent to the display area and including a pad area, a circuit layer in the display area and the pad area, and a light emitting element in the display area. The circuit layer includes a first conductive pattern in the pad area, an insulating layer on the first conductive pattern and in which is defined an opening exposing the first conductive pattern to outside the insulating layer, and a first insulating pattern which is on the insulating layer and extends into the opening to be on a top surface of the first conductive pattern.

12 Claims, 24 Drawing Sheets

(56)     References Cited

U.S. PATENT DOCUMENTS

2014/0138641  A1*   5/2014  Yi  ......................... H10K 59/12
                                                              438/34
2016/0190504  A1*   6/2016  Koshihara  .............. H10K 59/35
                                                              257/72
2018/0368270  A1*  12/2018  Seo  .......................... G06F 1/16
2019/0334115  A1*  10/2019  Matsuda  .............. H10K 59/873
2021/0118959  A1*   4/2021  Sano  ...................... H10K 59/88
2024/0276775  A1*   8/2024  Peng  ................... H10K 59/131

FOREIGN PATENT DOCUMENTS

KR      1020180003965  A      1/2018
KR          101970068  B1     4/2019
KR        20200060002  A      5/2020
KR        20200067576  A      6/2020
KR        20200087905  A      7/2020
KR        20210148550  A     12/2021

* cited by examiner

FIG. 2C
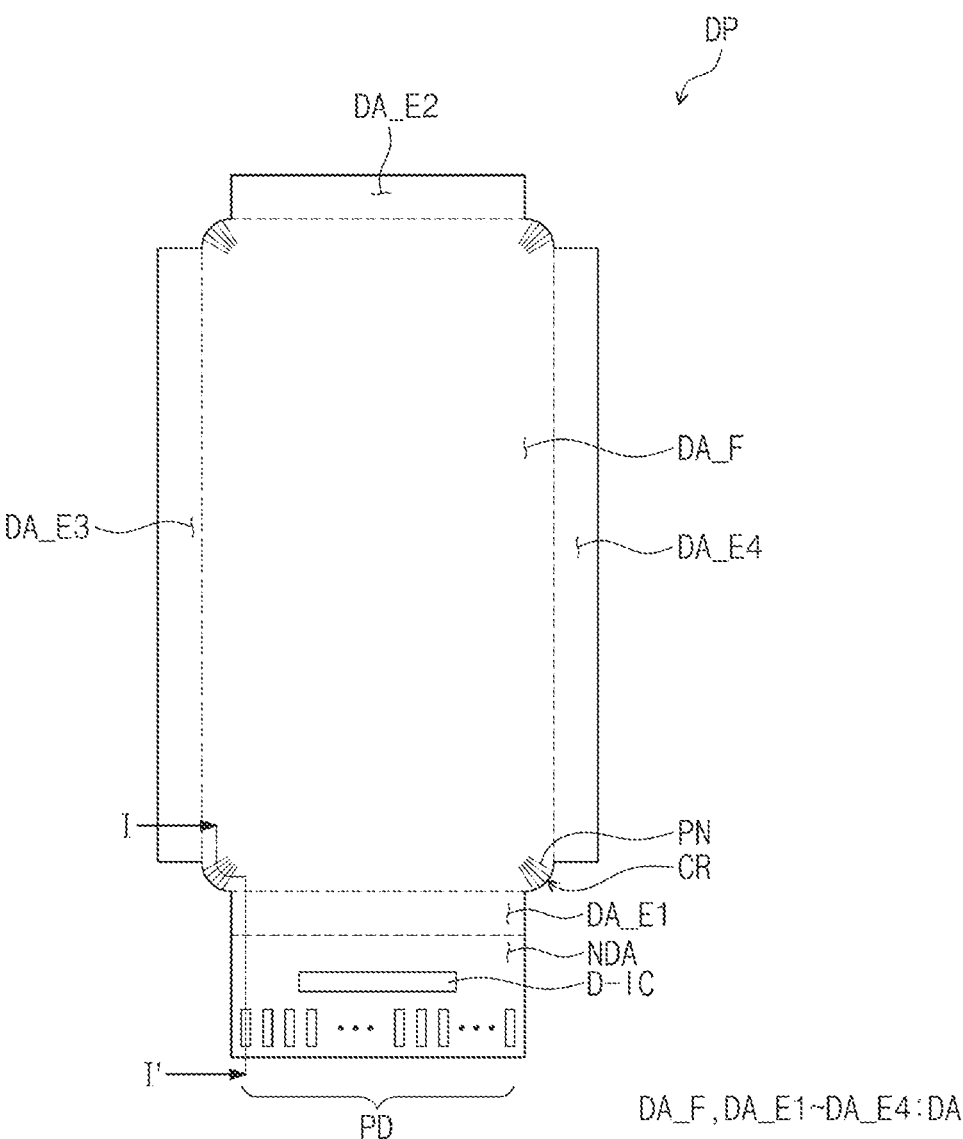
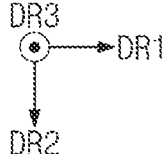

DISPLAY DEVICE COMPRISING A DISPLAY PANEL HAVING INSULATING LAYERS OVER A PAD AND METHOD OF PROVIDING THE DISPLAY PANEL

This U.S. non-provisional patent application claims priority under 35 U.S.C. § 119 of Korean Patent Application No. 10-2021-0176788, filed on Dec. 10, 2021, the entire contents of which are hereby incorporated by reference.

BACKGROUND

(1) Field

The present disclosure herein relates to a display device and a method of manufacturing a display panel included in the same, and more particularly, to a display panel with improved display quality.

(2) Description of the Related Art

A display device is used in various multimedia devices such as a television, a mobile phone, a tablet computer, and a game machine to provide image information to a user. The display device includes a light emitting display panel and provides a moving or still image to a user through light generated in the display panel.

The display panel may include a display area that emits light and a non-display area that transmits signals for driving the display area. Pads may be disposed in the non-display area, and the display panel may be connected to an external circuit board through the pads.

SUMMARY

The present disclosure provides a display device that prevents dark spot defects.

An embodiment of the invention may prevent silver particles from being formed through a reaction between an etchant and a metal material of pads which is exposed during a pixel etching process using the etchant.

An embodiment of the invention provides a display device including a window and a display panel which is on a lower portion of the window and includes a display area and a non-display area, where the display panel includes a base layer including a pad area overlapping the non-display area, a circuit layer including a first conductive pattern which overlaps the pad area and is on the base layer, an insulating layer in which an opening exposing a portion of the first conductive pattern is defined and which is on the first conductive pattern, and a first insulating pattern on the insulating layer, and a light emitting element layer including a light emitting element overlapping the display area, where the insulating layer includes an inner surface configured to define the opening and a second top surface which extends from the inner surface and is parallel to a first top surface of the first conductive pattern, and the first insulating pattern is on at least a portion of the second top surface and the inner surface.

In an embodiment, the first insulating pattern may be in contact with the at least a portion of the second top surface and the inner surface.

In an embodiment, the first insulating pattern may be in contact with a portion of the first top surface.

In an embodiment, the display area may include an element area overlapping the light emitting element and a groove area not overlapping the light emitting element and surrounding the element area.

In an embodiment, the circuit layer may further include a second conductive pattern which overlaps the element area and is in a same layer as the first conductive pattern, a third conductive pattern which overlaps the groove area and is in the same layer as the first conductive pattern, and a (2-1)-th insulating pattern on the third conductive pattern, where the insulating layer exposes a portion of the (2-1)-th insulating pattern.

In an embodiment, the (2-1)-th insulating pattern may be in contact with a top surface of the third conductive pattern.

In an embodiment, the first insulating pattern may overlap the element area and may not overlap at least a portion of the groove area.

In an embodiment, the light emitting element may include a first electrode, a second electrode, and a light emitting layer between the first electrode and the second electrode, where the first electrode is on the first insulating pattern and is electrically connected to the second conductive pattern through a contact hole penetrating the first insulating pattern and the insulating layer.

In an embodiment, the circuit layer may further include a (2-2)-th insulating pattern between the first conductive pattern and the first insulating pattern.

In an embodiment, the first insulating pattern may include an inorganic material, and the insulating layer may include an organic material.

In an embodiment, the base layer may include polyimide-based resin.

In an embodiment, the window may include a front area, a first side area which is bent from a first side of the front area and has a first curvature, a second side area which is bent from a second side of the front area and has a second curvature, and a corner area between the first side area and the second side area.

In an embodiment of the invention, a method of manufacturing (or providing) a display panel includes preparing a base layer including an element area, a groove area, a cut area, and a pad area, forming (or providing) a conductive layer on the base layer, forming a plurality of conductive patterns respectively overlapping the element area, the groove area, and the pad area by etching the conductive layer, forming a first inorganic insulating layer on the plurality of conductive patterns, forming a first inorganic pattern overlapping the groove area and not overlapping the element area and the cut area by patterning the first inorganic insulating layer, forming an organic insulating layer configured to cover the plurality of conductive patterns and the first inorganic pattern, forming an organic layer opening overlapping the pad area in the organic insulating layer, forming a second inorganic insulating layer on the organic insulating layer, forming a second inorganic pattern overlapping the pad area and the element area and not overlapping at least a portion of the groove area and the cut area by patterning the second inorganic insulating layer, disposing, on the second inorganic pattern, a hard mask including a first mask opening overlapping the pad area and including transparent conductive oxide, and removing a portion of the second inorganic pattern overlapping the pad area by using the hard mask.

In an embodiment, the first inorganic pattern may not overlap the pad area.

In an embodiment, in the forming of the first inorganic pattern, the first inorganic pattern may overlap the pad area.

In an embodiment, the method of manufacturing a display panel may further include forming a light emitting element in the element area by using an etchant including silver ions (Ag+) between the forming of the second inorganic pattern and the disposing of the hard mask.

In an embodiment, the conductive layer may include aluminum.

In an embodiment, the base layer may include polyimide-based resin.

In an embodiment, the removing of the portion of the second inorganic pattern may include forming a through-hole penetrating the base layer and the organic insulating layer in the cut area.

In an embodiment, the hard mask may further include second mask openings overlapping the groove area and a third mask opening overlapping the cut area.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to describe principles of the invention. In the drawings:

FIG. 2C is a plan view of a display panel according to an embodiment;

FIG. 3A is a cross-sectional view of a display panel according to an embodiment;

FIG. 4A is a cross-sectional view of a display panel according to an embodiment;

DETAILED DESCRIPTION

Figure 1A:
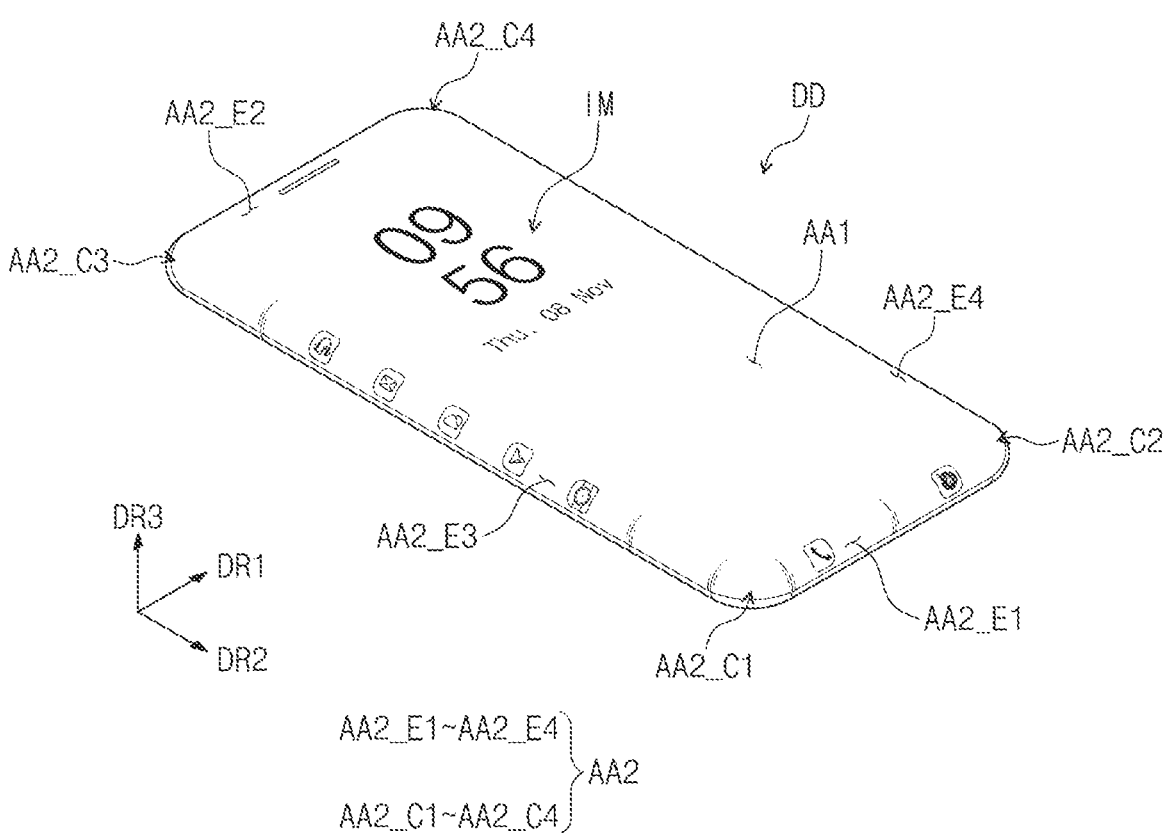
FIG. 1A is an assembled perspective view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being related to another element such as being "on", "connected to", or "coupled to" another element or layer, it can be directly on, connected to, or coupled to the other element or layer, or intervening elements or layers may be present.

Like reference numerals refer to like elements throughout this specification. As used herein, a reference number may indicate a singular element or a plurality of the element. For example, a reference number labeling a singular form of an element within the drawing figures may be used to reference a plurality of the singular element within the text of specification.

In the figures, the thicknesses, ratios, and dimensions of elements are exaggerated for effective description of the technical contents. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the invention.

The terminology used herein is for the purpose of describing particular embodiments only and is not intended to be limiting. As used herein, the singular forms, "a", "an", and "the" are intended to include the plural forms as well, unless the context clearly indicates otherwise.

Spatially relative terms, such as "beneath", "below", "lower", "above", and "upper", may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be further understood that the terms "include" or "have", when used in this specification, specify the presence of stated features, integers, steps, operations, elements, components, and/or groups thereof, but do not preclude the presence or addition of one or more other features, integers, steps, operations, elements, components, and/or groups thereof.

In this specification, when a layer, film, region, plate, etc. is referred to as "directly disposed on" another element, this may mean that there is no intervening layer, film, region, plate, etc. present. For example, "directly disposed on" may mean disposing two layers or two members without using an additional member such as an adhesive member between the two layers or two members.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and should not be interpreted in an overly idealized or overly formal sense unless expressly so defined herein.

Hereinafter, the invention will be explained in detail with reference to the accompanying drawings.

Figure 1B:
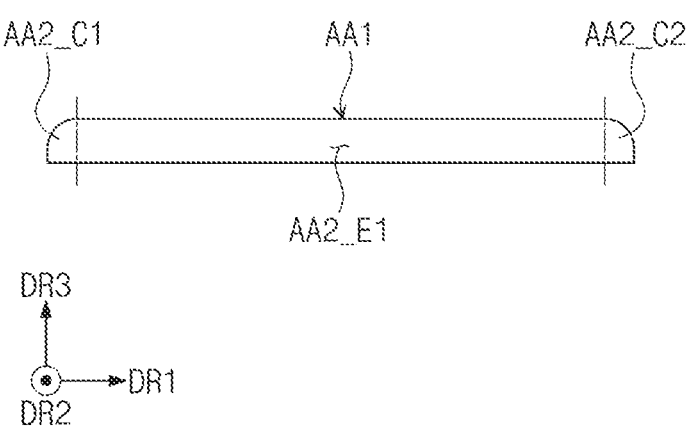
FIG. 1B is a side view of the display device illustrated in FIG. 1A as viewed in a second direction.
Figure 1C:
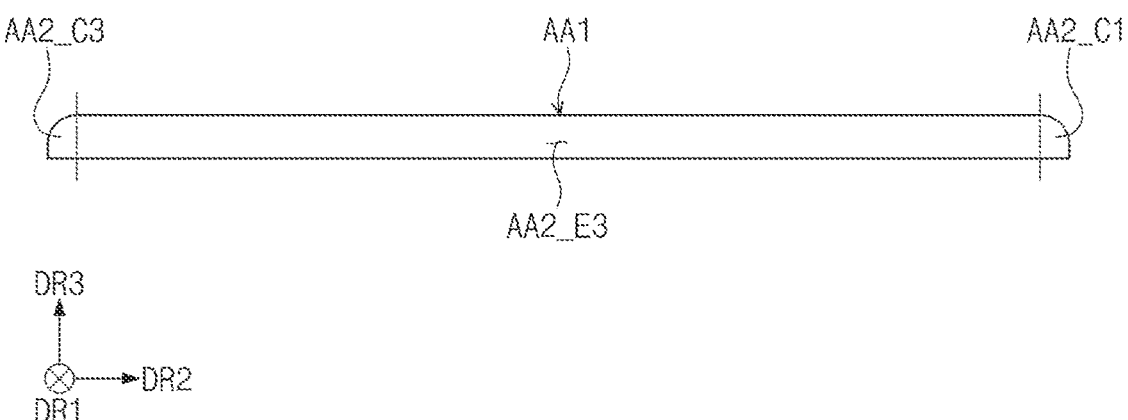
FIG. 1C is a side view of the display device illustrated in FIG. 1A as viewed in a first direction.
Figure 1D:
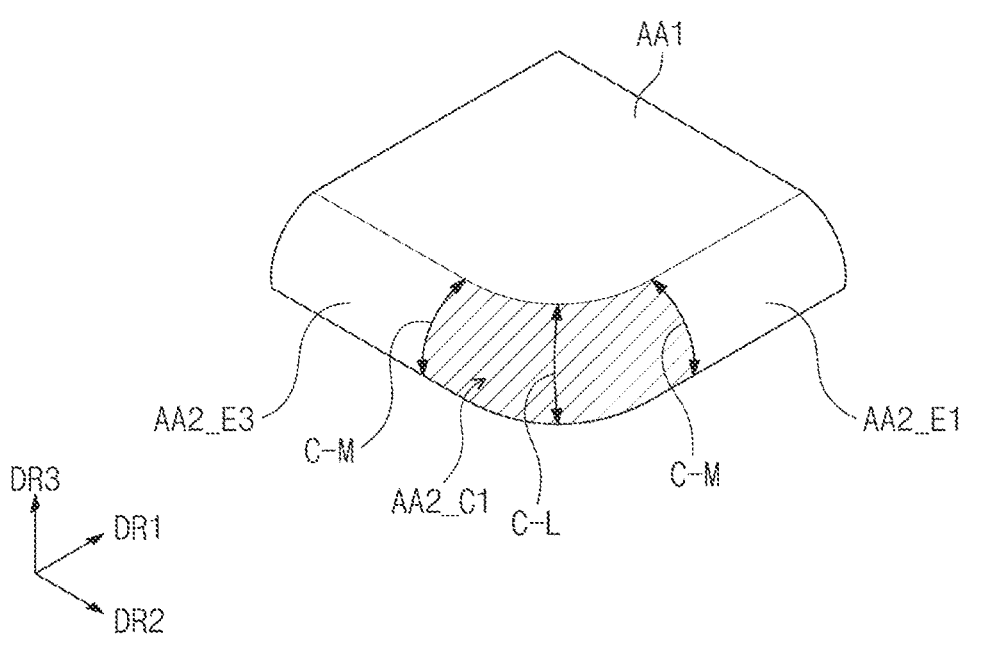
FIG. 1D is an enlarged perspective view of a corner of the display device illustrated in FIG. 1A.

FIG. 1A is an assembled perspective view of a display device DD according to an embodiment of the invention. FIG. 1B is a side view of the display device DD illustrated in FIG. 1A as viewed in a second direction DR2. FIG. 1C is a side view of the display device DD illustrated in FIG. 1A as viewed in a first direction DR1. FIG. 1D is an enlarged perspective view of a corner of the display device DD illustrated in FIG. 1A.

In FIGS. 1A to 1D, a display device DD is exemplarily illustrated as a smartphone. However, the display device DD is not limited thereto and may be a large-sized display device such as a television and a monitor, and a medium- and small-sized display device such as a mobile phone, a tablet, a car navigation device, a game machine, and a smart watch.

Three-dimensional active areas AA1 and AA2 taken together in which an image IM is displayed may be defined in the display device DD. In FIG. 1A, a date, time, and icon images are illustrated as an example of the image IM.

The active areas AA1 and AA2 may include a first active area AA1 having a planar shape and a second active area AA2 which is bent from the first active area AA1. The second active area AA2 may be an area which is curved with a predetermined curvature from the first active area AA1. However, the shape of the second active area AA2 is not limited thereto. The first and second active areas AA1 and AA2 are only areas divided according to shapes and may substantially implement one display surface of the display device DD.

Although not illustrated separately, an image IM may not be displayed in a portion of the second active area AA2. For example, a bezel area may be defined along an edge of the second active area AA2 which is furthest from the first active area AA1, and an image IM may not be displayed at the bezel area.

The first active area AA1 may be disposed in a single plane, such as being parallel to a plane defined by a first direction DR1 and a second direction DR2. A normal direction of the first active area AA1, that is, a thickness direction of the display device DD may be parallel to a third direction DR3. A front surface (or a top surface) and a rear surface (or a bottom surface) of each of members of the display device DD are distinguished by the third direction DR3. However, the first to third directions DR1, DR2, and DR3 are defined by way of example and may be defined differently from in FIG. 1A.

The first active area AA1 may have sides which define an outer edge or boundary of the first active area AA1, and corners at which two sides respectively meet each other. The second active area AA2 may be an area bent and extended from the first active area AA1. The second active area AA2 may include edge active areas AA2_E1 to AA2_E4 respectively bent from sides of the first active area AA1 and corner active areas AA2_C1 to AA2_C4 respectively disposed at corners of the first active area AA1.

The second active area AA2 includes a first edge active area AA2_E1 bent from a first side of the first active area AA1, a second edge active area AA2_E2 bent from a second side of the first active area AA1, a third edge active area AA2_E3 bent from a third side of the first active area AA1, and a fourth edge active area AA2_E4 bent from a fourth side of the first active area AA1. The second active area AA2 may include a first corner active area AA2_C1 disposed at (or corresponding to) a first corner of the first active area AA1, a second corner active area AA2_C2 disposed at a second corner of the first active area AA1, a third corner active area AA2_C3 disposed at a third corner of the first active area AA1, and a fourth corner active area AA2_C4 disposed at a fourth corner of the first active area AA1.

The first corner active area AA2_C1 is disposed between the first edge active area AA2_E1 and the third edge active area AA2_E3, and the second corner active area AA2_C2 is disposed between the first edge active area AA2_E1 and the fourth edge active area AA2_E4. The third corner active area AA2_C3 is disposed between the second edge active area AA2_E2 and the third edge active area AA2_E3, and the fourth corner active area AA2_C4 is disposed between the second edge active area AA2_E2 and the fourth edge active area AA2_E4. The number of the edge active areas AA2_E1 to AA2_E4 and the number of the corner active areas AA2_C1 to AA2_C4 are not limited thereto. That is, the number of the edge active areas AA2_E1 to AA2_E4 and the number of the corner active areas AA2_C1 to AA2_C4 with together form the second active area AA2 may vary according to the shape of the first active area AA1.

The first to fourth edge active areas AA2_E1 to AA2_E4 may be bent to respectively have first to fourth curvatures in (or along) the third direction DR3. Each of the first to fourth edge active areas AA2_E1 to AA2_E4 may have a single curvature. The curvatures or radii of curvature of the first to fourth edge active areas AA2_E1 to AA2_E4 may be the same, or some thereof may be the same with a remainder thereof different from each other.

Each of the first to fourth corner active areas AA2_C1 to AA2_C4 may be bent to have a predetermined curvature in the third direction DR3. Each of the first to fourth corner active areas AA2_C1 to AA2_C4 may have multiple curvatures (or a double curvature). In an embodiment, each of the first to fourth corner active areas AA2_C1 to AA2_C4 may also have a single curvature.

Referring to the first corner active area AA2_C1 of FIG. 1D, the first corner active area AA2_C1 may extend from and be defined between the first active area AA1, the first edge active area AA2_E1, and the third edge active area AA2_E3. The first corner active area AA2_C1 may have a maximum curvature C-M in areas respectively closest to the first edge active area AA2_E1 and the third edge active area AA2_E3 (or at a boundary between the first corner active area AA2_C1 and the first edge active area AA2_E1 and a boundary between the first corner active area AA2_C1 and the third edge active area AA2_E3). The first corner active area AA2_C1 may have a minimum curvature C-L in an area farthest from the first edge active area AA2_E1 and the third edge active area AA2_E3. The maximum curvature C-M may be the same as the first curvature of the first edge active area AA2_E1 and the third curvature of the third edge active area AA2_E3.

Figure 2A:
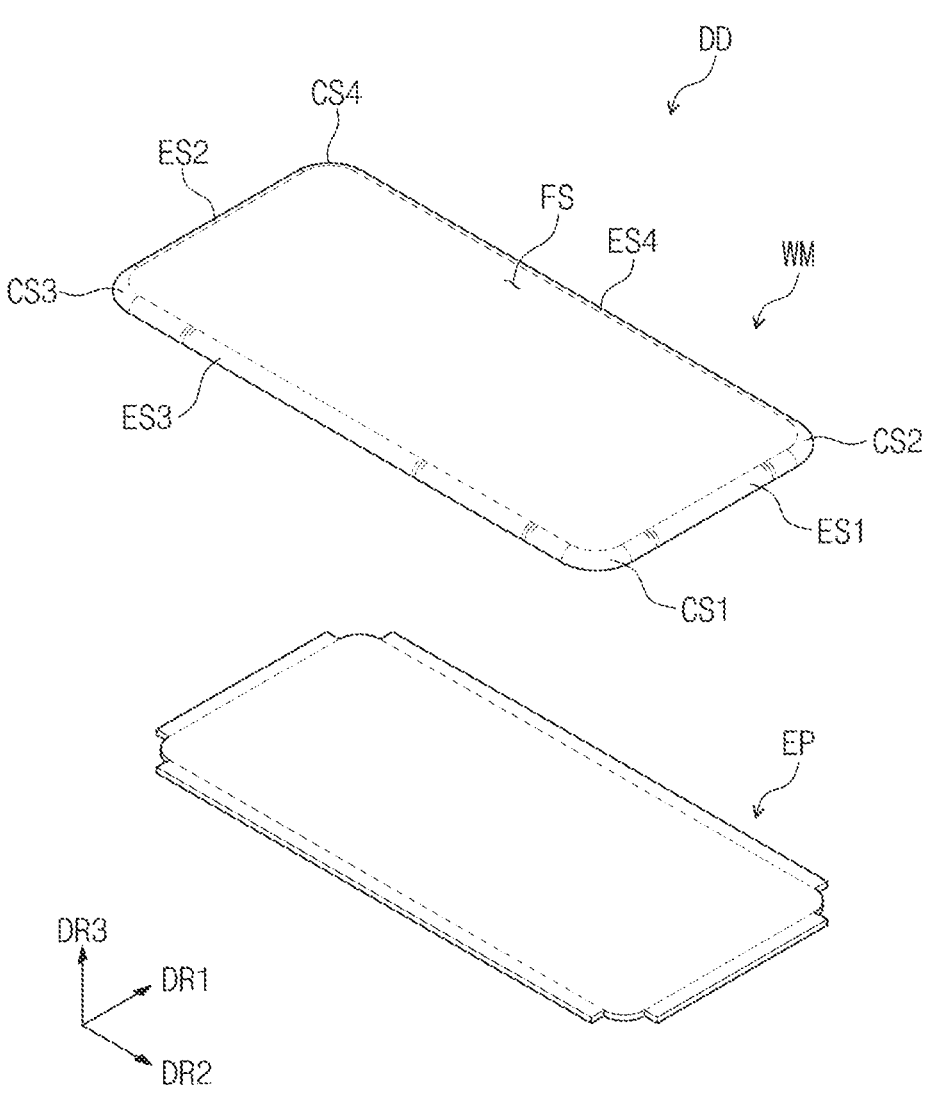
FIG. 2A is an exploded perspective view of a display device according to an embodiment.
Figure 2B:
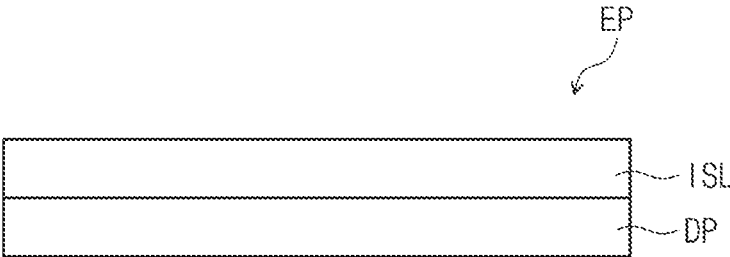
FIG. 2B is a cross-sectional view of an electronic panel according to an embodiment.

FIG. 2A is an exploded perspective view of a display device DD according to an embodiment of the invention. FIG. 2B is a cross-sectional view of an electronic panel EP according to an embodiment of the invention. FIG. 2C is a plan view of a display panel DP according to an embodiment of the invention.

Referring to FIG. 2A, the display device DD may include a window WM and an electronic panel EP facing each other. Although not illustrated separately, a support member for supporting the electronic panel EP may be further included in the display device DD. The support member may include a material having a relatively high rigidity. For example, the support member may include glass, plastic, or metal, or may include a plurality of frames and/or plates constituted of a combination thereof.

The window WM is disposed on the electronic panel EP. The window WM may be optically transparent. For example, the window WM may include a glass substrate, and specifically, the glass substrate may be a chemically-strengthened tempered glass substrate.

The window WM may be of a single-layer structure or a multilayer structure. For example, although the window WM may be of a single-layer structure including a glass substrate, the window WM is not limited thereto and may be of a multilayer structure including a coating film with which the glass substrate is coated, a filling member, or a polymer film disposed on the glass substrate.

The image IM displayed on a display panel DP may be viewable from outside the display device DD, through the window WM. That is, the display surface (or outer surface) of the display device DD may be defined by the window WM.

In an embodiment, the window WM may include a base member and a bezel pattern. The base member may include glass, plastic, or a film, and may have a single-layer or multilayer structure. The bezel pattern may overlap a partial area of the base member to define the bezel area described above with reference to FIGS. 1A to 1D. The bezel pattern of the window WM may be omitted by disposing a pattern corresponding to the bezel pattern in another member constituting the display device DD.

The base member of the window WM may include a front area FS, side areas ES1 to ES4 bent from the front area FS, and corner areas CS1 to CS4 adjacent to the side areas ES1 to ES4. The front area FS may correspond to the first active area AA1, the side areas ES1 to ES4 may respectively correspond to the edge active areas AA2_E1 to AA2_E4, and the corner areas CS1 to CS4 may respectively correspond to the corner active areas AA2_C1 to AA2_C4. In this specification, "an area corresponds to another area" means that the two areas overlap each other, and the two areas are not limited to having the same dimension or surface area.

In FIG. 2A, the electronic panel EP is illustrated, as an example, as having a shape corresponding to the front area FS and the side areas ES1 to ES4 of the window WM together with each other. However, an embodiment is not limited thereto, and the electronic panel EP may also have a shape corresponding to the front area FS, the side areas ES1 to ES4, and the corner areas CS1 to CS4 of the window WM.

Referring to FIG. 2B, the electronic panel EP according to an embodiment may include the display panel DP and an input sensor ISL (e.g., input sensing layer) which is disposed on the display panel DP.

The display panel DP may generate the image IM. The display panel DP may be a light emitting display panel and is not particularly limited. For example, the display panel DP may be an organic light emitting display panel or a quantum dot light emitting display panel. A light emitting layer of the organic light emitting display panel may include an organic light emitting material. A light emitting layer of the quantum dot light emitting display panel may include quantum dots, quantum rods, and the like. Hereinafter, the display panel DP will be described as the organic light emitting display panel.

The input sensor ISL may be disposed on the display panel DP and may obtain coordinate information of an external input applied to the display device DD. For example, the external input may be applied from an input tool such as a body part or a pen. The external input may include various types of external inputs such as light, heat, pressure and proximity. The input sensor ISL may be formed (or provided) on the display panel DP through a continuous process. That is, the input sensor ISL may be directly disposed on the display panel DP. In this specification, "directly disposed" may mean that a third component is not disposed between the input sensor ISL and the display panel DP. As being "directly" related, elements may form an interface therebetween, without being limited thereto.

However, an embodiment is not limited thereto, and in an embodiment of the invention, an input sensor ISL may be bonded to an upper portion of a display panel DP through an intervening member such as an adhesive member.

Although not illustrated, a functional layer such as an anti-reflection member may be further included in the display device DD. The anti-reflection member may be disposed between the window WM and the electronic panel EP or disposed inside the electronic panel EP.

Referring to FIG. 2C, the display panel DP may include a display area DA in which pixels are disposed. The pixels may be a display element with which an image IM is generate, a light is generated and/or emitted, etc. Although not illustrated separately, a peripheral area defined along an outer edge of the display area DA may be defined in the display panel DP. The peripheral area may correspond to the bezel area described above.

Referring to FIG. 2A and FIG. 2C together, the display area DA may include a front display area DA_F and first to fourth side display areas DA_E1 to DA_E4. The front display area DA_F is an area corresponding to the front area FS when the electronic panel EP is attached to the window WM. The first to fourth side display areas DA_E1 to DA_E4 are areas respectively corresponding to first to fourth side areas ES1 to ES4 when the electronic panel EP is attached to the window WM.

Cut patterns PN may be disposed at corners CR of the display panel DP. Each cut pattern PN may have a stripe shape, and one or more cut pattern PN may be disposed at a corner CR. The display panel DP may have a double curvature structure at each of the corners CR by including a plurality of cut patterns PN at a respective one of the corners CR.

The display panel DP may further include a non-display area NDA extending from the display area DA, such as from the first side display area DA_E1. A driving chip D-IC and pads PD may be disposed in the non-display area NDA. The driving chip D-IC may provide a driving signal to one or more among the front display area DA_F and the first to fourth side display areas DA_E1 to DA_E4 of the display panel DP. The driving chip D-IC may be mounted on the display panel DP. However, an embodiment is not limited thereto, and the driving chip D-IC may also be mounted on a printed circuit board as an external component which is connected to the display panel DP. The display panel DP may be electrically connected to the external printed circuit board (not illustrated) through the pads PD.

In an embodiment of the invention, the display device DD, the electronic panel EP, the input sensor layer ISL and/or the display panel DP may be bendable, foldable, rollable, etc. One or more of these elements, and various components or layers of these elements may be deformable together with each other. Referring to FIG. 2C, the display panel DP may be bendable at the non-display area NDA, to dispose a portion of the non-display area NDA on a rear surface of the front display area DA_F.

Figure 3A:
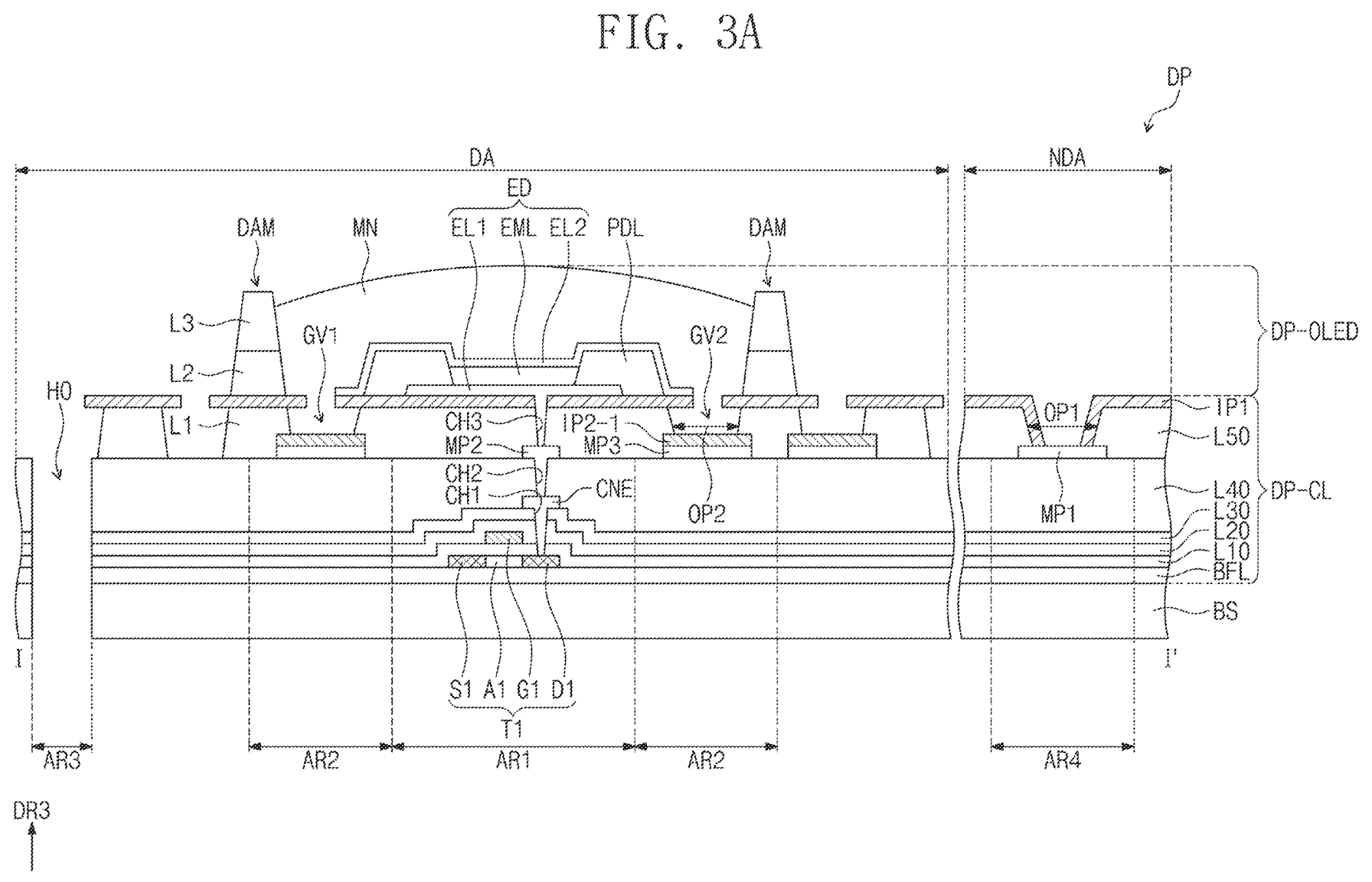
Figure 3B:
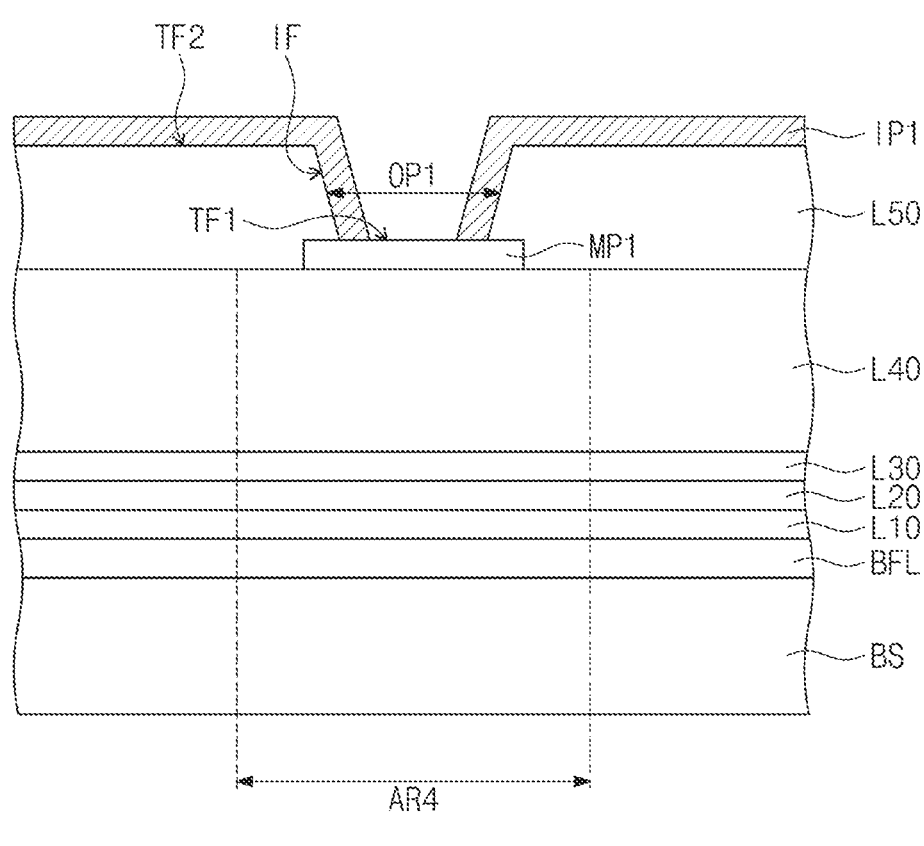
FIG. 3B is an enlarged view of a portion of the cross-sectional view of the display panel illustrated in FIG. 3A.

FIG. 3A is an enlarged cross-sectional view of a display panel DP according to an embodiment of the invention. FIG. 3B is an enlarged view of a portion of the cross-sectional view of the display panel DP illustrated in FIG. 3A.

FIG. 3A is a cross-sectional view taken along line I-I' illustrated in FIG. 2C. Referring to FIG. 3A, the display panel DP according to an embodiment includes a base layer BS, a circuit layer DP-CL disposed on the base layer BS, and a light emitting element layer DP-OLED which is disposed on the circuit layer DP-CL and includes a light emitting element ED.

The base layer BS may be a member providing a base surface on which the circuit layer DP-CL is disposed. The base layer BS may be a rigid substrate or a flexible substrate capable of bending, folding, rolling, and the like. The base layer BS may be a substrate including resin. For example, the base layer BS may include polyimide-based resin (e.g., a polyimide resin). However, an embodiment of the invention is not limited thereto, and the base layer BS may be an inorganic layer or a composite material layer.

The base layer BS includes an element area AR1 (hereinafter a first area AR1) overlapping the light emitting element ED, a groove area AR2 (hereinafter a second area AR2) surrounding the first area AR1, a cut area AR3 (hereinafter a third area AR3) including a through-hole HO passing through a thickness of the base layer BS, and a pad area AR4 (hereinafter a fourth area AR4) including a first conductive pattern MP1. The first area AR1, the second area AR2, and the third area AR3 may overlap (or correspond to) the display area DA, and the fourth area AR4 may overlap the non-display area NDA. The through-hole HO defined in the third area AR3 may correspond to any one of the cut patterns PN illustrated in FIG. 2C.

The circuit layer DP-CL may be disposed on the base layer BS. In an embodiment, the circuit layer DP-CL includes a buffer layer BFL, first to fifth insulating layers L10, L20, L30, L40, and L50, a transistor T1, a connection electrode CNE, insulating patterns IP1 and IP2-1, and a conductive pattern layer including a conductive pattern provided in plural including the first conductive pattern MP1 and conductive patterns MP2 and MP3 (e.g., a plurality of conductive patterns).

The buffer layer BFL may be disposed on the base layer BS. The buffer layer BFL may prevent metal atoms or impurities from diffusing from the base layer BS into the transistor T1 disposed on the buffer layer BFL.

The transistor T1 may be disposed on the buffer layer BFL and may be covered by the first insulating layer L10 and the second insulating layer L20. Although one transistor T1 is illustrated in FIG. 3A for convenience, a plurality of additional transistors connected to the transistor T1 may be further disposed in the circuit layer DP-CL.

The transistor T1 may include a source S1, an active A1 (e.g., active region), and a drain D1 disposed on the buffer layer BFL, and a gate G1 disposed on the first insulating layer L10. An upper electrode may be disposed on the gate G1 although not illustrated, and the gate G1 and the upper electrode may form a storage capacitor.

The first insulating layer L10 may be disposed on the buffer layer BFL. The first insulating layer L10 may be an inorganic layer and/or an organic layer and may have a single-layer structure or a multilayer structure. The first insulating layer L10 may include at least one of aluminum oxide, titanium oxide, silicon oxide, silicon nitride, silicon oxynitride, zirconium oxide, or hafnium oxide. In this embodiment, the first insulating layer L10 may be a single-layer silicon oxide layer. Each of the second to fifth insulating layers L20, L30, L40, and L50 to be described later as well as the first insulating layer L10 may be an inorganic layer and/or an organic layer and may have a single-layer structure or a multilayer structure. The inorganic layer may include at least one of the above-described materials but is not limited thereto.

The second insulating layer L20 may be disposed on the first insulating layer L10. The second insulating layer L20 may cover the gate G1.

The third insulating layer L30 may be disposed on the second insulating layer L20. The connection electrode CNE may be disposed on the third insulating layer L30. The connection electrode CNE may be connected to the drain D1 through a contact hole CH1 (e.g., a first contact hole) penetrating the first to third insulating layers L10, L20, and L30.

The fourth insulating layer L40 may be disposed on the third insulating layer L30. The fourth insulating layer L40 may cover the connection electrode CNE. The fifth insulating layer L50 (or an insulating layer L50) may be disposed on the fourth insulating layer L40.

Each of the fourth insulating layer L40 and the fifth insulating layer L50 may be an organic layer. For example, each of the fourth insulating layer L40 and the fifth insulating layer L50 may include a general-purpose polymer such as benzocyclobutene (BCB), polyimide, hexamethyldisiloxane (HMDSO), polymethylmethacrylate (PMMA), and polystyrene (PS), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, blends thereof, and the like.

The conductive patterns MP1, MP2, and MP3 are disposed on the fourth insulating layer L40. The conductive patterns MP1, MP2, and MP3 include the first conductive pattern MP1 overlapping the fourth area AR4, a second conductive pattern MP2 overlapping the first area AR1, and a third conductive pattern MP3 overlapping the second area AR2. The first to third conductive patterns MP1, MP2, and MP3 may be disposed in the same layer to be spaced apart from each other. As being in a same layer as each other, elements may be formed in a same process and/or as including a same material, elements may be respective portions of a same material layer, may be on a same layer by forming an interface with a same underlying or overlying layer, etc., without being limited thereto. The first conductive pattern MP1 may correspond to any one of the aforementioned pads PD (see FIG. 2C).

The fifth insulating layer L50 is disposed on the fourth insulating layer L40. The fifth insulating layer L50 may cover at least a portion of each of the first to third conductive patterns MP1, MP2, and MP3.

A first opening OP1 and a second opening OP2 may be defined in the fifth insulating layer L50. The first opening OP1 (or an opening OP1) may overlap the first conductive pattern MP1 and may expose a portion of the first conductive pattern MP1 to outside the fifth insulating layer L50. The second opening OP2 may overlap the third conductive pattern MP3. At least a portion of the second conductive pattern MP2 may be covered by the fifth insulating layer L50. A sidewall of the fifth insulating layer L50 may define the various openings.

A first insulating pattern IP1 is disposed on the fifth insulating layer L50. The first insulating pattern IP1 may be provided in plural including a plurality of first insulating patterns IP1 disconnected from each other. The first insulating pattern IP1 may be in contact with a portion of the first conductive pattern MP1 (e.g., a first portion) and may not be in contact with another portion thereof (e.g., a second portion closer to an edge of the first conductive pattern MP1).

A (2-1)-th insulating pattern IP2-1 is disposed on the third conductive pattern MP3. Specifically, the (2-1)-th insulating pattern IP2-1 may be in contact with a top surface of the third conductive pattern MP3. The (2-1)-th insulating pattern IP2-1 and the third conductive pattern MP3 may have the same width in the second direction DR2. Each of the (2-1)-th insulating pattern IP2-1 and the third conductive pattern MP3 may have an outer edge. As having the same width, the outer edge of the (2-1)-th insulating pattern IP2-1 and the outer edge of the third conductive pattern MP3 may be aligned with each other, without being limited thereto.

The second opening OP2 defined in the fifth insulating layer L50 may expose a portion of the (2-1)-th insulating pattern IP2-1 to outside the fifth insulating layer L50.

Each of the first insulating pattern IP1 and the (2-1)-th insulating pattern IP2-1 may include an insulating material, for example, an inorganic material. Specifically, each of the first insulating pattern IP1 and the (2-1)-th insulating pattern IP2-1 may include $SiN_X$. However, an embodiment is not limited thereto. The first insulating pattern IP1 and the (2-1)-th insulating pattern IP2-1 may be formed of the same material or may include different materials.

The light emitting element layer DP-OLED may be disposed on the circuit layer DP-CL. The light emitting element layer DP-OLED may include the light emitting element ED and a pixel defining film PDL disposed in the first area AR1, and dams DAM and grooves GV1 and GV2 disposed in the second area AR2.

The light emitting element ED may include a first electrode EL1 a second electrode EL2 facing the first electrode EL1, and a light emitting layer EML disposed between the first electrode EL1 and the second electrode EL2. The first electrode EL1 may be connected to the second conductive pattern MP2 through a contact hole CH3 (e.g., a third contact hole) penetrating the fifth insulating layer L50, and the second conductive pattern MP2 may be electrically connected to the connection electrode CNE through a contact hole CH2 (e.g., a second contact hole) penetrating the fourth insulating layer L40.

Although one light emitting element ED is illustrated in FIG. 3A as an example, an embodiment of the invention is not limited thereto, and the display panel DP may include two or more light emitting elements ED. In addition, the two or more light emitting elements ED may emit light of the same color or light of different colors.

The first electrode EL1 may be disposed on the fifth insulating layer L50 and may be disposed, for example, on the first insulating pattern IP1. However, an embodiment is not limited thereto, and the first insulating pattern IP1 may not be disposed between the first electrode EL1 and the fifth insulating layer L50.

The first electrode EL1 may be a transmissive electrode, a transflective electrode, or a reflective electrode. According to an embodiment of the invention, the first electrode EL1 may include at least one substance selected from Ag, Mg, Cu, Al, Pt, Pd, Au, Ni, Nd, Ir, Cr, Li, Ca, LiF, Mo, Ti, W, In, Sn, and Zn, a compound of two or more substances selected therefrom, a mixture of two or more substances selected therefrom, or oxide thereof.

When the first electrode EL1 is the transmissive electrode, the first electrode EL1 may include transparent metal oxide such as indium tin oxide (ITO), indium zinc oxide (IZO), zinc oxide (ZnO), and indium tin zinc oxide (ITZO). When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca (a laminated structure of LiF and Ca), LiF/Al (a laminated structure of LiF and Al), Mo, Ti, W, or a compound or mixture thereof (e.g., a mixture of Ag and Mg). Alternatively, the first electrode EL1 may be of a structure of a plurality of layers including a reflective film or a transflective film formed of the above-described materials and a transparent conductive film formed of indium tin oxide (ITO), indium zinc oxide (IZO), zinc oxide (ZnO), indium tin zinc oxide (ITZO), etc. For example, the first electrode EL1 may have a three-layer structure of ITO/Ag/ITO but is not limited thereto.

The light emitting layer EML may include, for example, an organic light emitting material, an inorganic light emitting material, an organic-inorganic light emitting material, quantum dots, quantum rods, micro-LEDs, or nano-LEDs.

The second electrode EL2 may include at least one substance selected from Ag, Mg, Cu, Al, Pt, Pd, Au, Ni, Nd, Ir, Cr, Li, Ca, LiF, Mo, Ti, W, In, Sn, and Zn, a compound of two or more substances selected therefrom, a mixture of two or more substances selected therefrom, or oxide thereof.

The second electrode EL2 may be a transmissive electrode, a transflective electrode, or a reflective electrode. When the second electrode EL2 is the transmissive electrode, the second electrode EL2 may be formed of transparent metal oxide such as indium tin oxide (ITO), indium zinc oxide (IZO), zinc oxide (ZnO), and indium tin zinc oxide (ITZO).

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca (a laminated structure of LiF and Ca), LiF/A1 (a laminated structure of LiF and Al), Mo, Ti, Yb, W, or a compound or mixture including the same (e.g., AgMg, AgYb, or MgYb). Alternatively, the second electrode EL2 may be of a structure of a plurality of layers including a reflective film or a transflective film formed of the above-described materials and a transparent conductive film formed of indium tin oxide (ITO), indium zinc oxide (IZO), zinc oxide (ZnO), indium tin zinc oxide (ITZO), etc. For example, the second electrode EL2 may include the afore-mentioned metal material, a combination of two or more metal materials selected from the aforementioned metal materials, oxide of the aforementioned metal materials, or the like.

The pixel defining film PDL may be disposed on the first insulating pattern IP1 and may cover a portion of the first electrode EL1 of the light emitting element ED. That is, the pixel defining film PDL may expose a portion of the first electrode EL1 to outside the pixel defining film PDL.

The first insulating pattern IP1 may overlap the first area AR1. For example, the first insulating pattern IP1 may overlap the light emitting element ED. Specifically, the first insulating pattern IP1 may overlap light emitting elements ED disposed at the corners CR (see FIG. 2C) of the display panel DP. The first insulating pattern IP1 may not overlap light emitting elements ED disposed in a portion other than the corners CR of the display panel DP.

The light emitting elements ED disposed at the corners CR of the display panel DP may be light emitting elements ED disposed adjacent to the cut patterns PN and may be, for example, light emitting elements ED disposed between the cut patterns PN. Meanwhile, as described above, each of the cut patterns PN may correspond to the through-hole HO formed in the third area AR3 of FIG. 3A.

The dams DAM and the grooves GV1 and GV2 may be disposed in the second area AR2 surrounding the first area AR1. Each of the dams DAM may include a first layer L1 disposed on the fourth insulating layer L40, a second layer L2 disposed on the first layer L1, and a third layer L3 disposed on the second layer L2. Although the first insulating pattern IP1 is illustrated to be disposed between the first layer L1 and the second layer L2, an embodiment is not limited thereto. For example, the first insulating pattern IP1 may not be disposed between the first layer L1 and the second layer L2.

The first layer L1 may be formed by the same process as the fifth insulating layer L50, and the second layer L2 may be formed by the same process as the pixel defining film PDL.

The grooves GV1 and GV2 may be formed between the dams DAM and the light emitting element ED. Sidewalls of the dams DAM may define the various grooves. The second area AR2 may be an area in which the grooves GV1 and GV2 are disposed. The grooves GV1 and GV2 may overlap the third conductive pattern MP3 and the (2-1)-th insulating pattern IP2-1.

Each of the grooves GV1 and GV2 is an area in which the fifth insulating layer L50 is not disposed, and may have a recessed shape compared with a peripheral area in which the fifth insulating layer L50 is disposed.

To form a structure at the grooves GV1 and GV2, the first insulating pattern IP1 may not overlap at least a portion of the second area AR2 and may have an undercut shape in the second area AR2.

A filler MN may be disposed between the dams DAM and may cover (or fill) the grooves GV1 and GV2 and may cover the light emitting element ED. The filler MN may include at least one of an organic material or an inorganic material.

Referring to FIG. 3A and FIG. 3B together, the first opening OP1 exposing at least a portion of the first conductive pattern MP1 is defined in the fifth insulating layer L50. The first opening OP1 exposes at least a portion of a first top surface TF1 of the first conductive pattern MP1.

The fifth insulating layer L50 includes an inner surface IF (e.g., a sidewall) defining the first opening OP1 and a second top surface TF2 that is parallel to the first top surface TF1 of the first conductive pattern MP1 and extends from the inner surface IF. The second top surface TF2 may be furthest from the first conductive pattern MP1 along the thickness direction of the display panel DP.

The first insulating pattern IP1 is disposed on the fifth insulating layer L50. The first insulating pattern IP1 is disposed on and extends along at least a portion of the second top surface TF2 and the inner surface IF. Specifically, the first insulating pattern IP1 is in contact with the at least a portion of the second top surface TF2 and the inner surface IF. One end (e.g., a first end) of the first insulating pattern IP1 may be in the first opening OP1 to contact with a portion of the first top surface TF1 of the first conductive pattern MP1.

Accordingly, a portion of the first top surface TF1 of the first conductive pattern MP1 is exposed to outside the fifth insulating layer L50, and the first insulating pattern IP1 is in contact with a portion of the exposed portion of the first top surface TF1. The first insulating pattern IP1 is not in contact with another portion of the exposed portion of the first top surface TF1. Accordingly, the first conductive pattern MP1 is exposed to outside the display panel DP may be electrically connected to the circuit board and may function as one of the pads PD (see FIG. 2C) of the display panel DP.

Figure 4A:
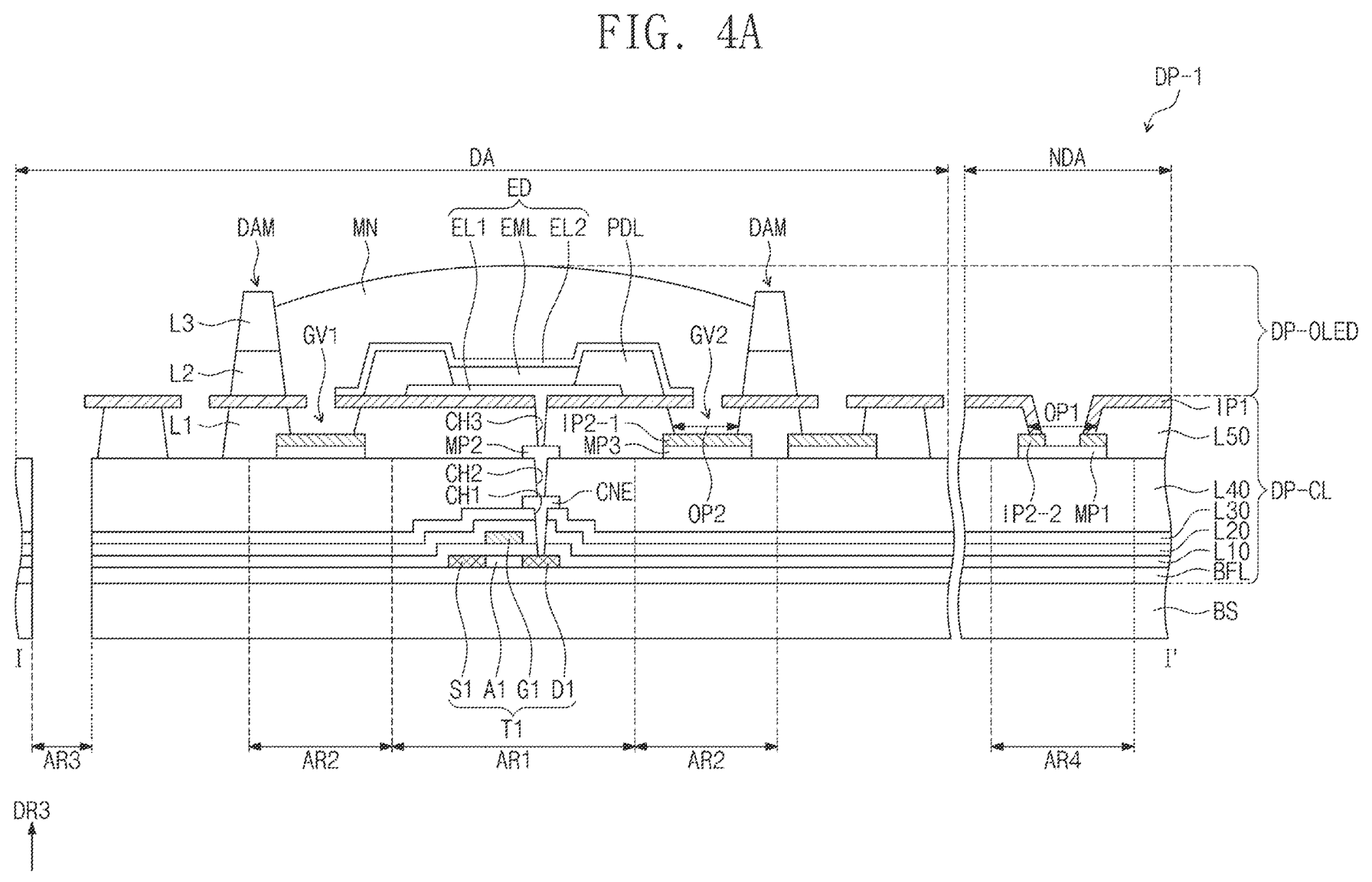
Figure 4B:
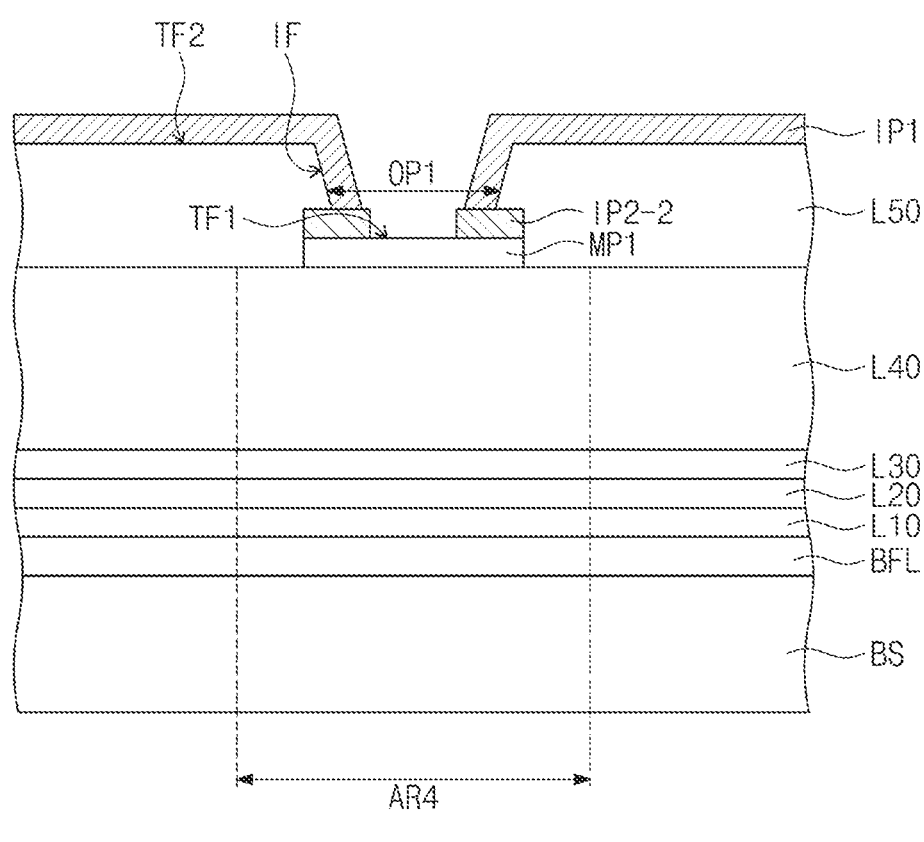
FIG. 4B is an enlarged view of a portion of the cross-sectional view of the display panel illustrated in FIG. 4A.

FIG. 4A is a cross-sectional view of a display panel DP according to an embodiment of the invention. FIG. 4B is an enlarged view of a portion of the cross-sectional view of the display panel DP illustrated in FIG. 4A. Detailed descriptions of components, among the components of FIG. 4A and FIG. 4B, the same as those of FIG. 3A and FIG. 3B will not be given as the corresponding descriptions given above with reference to FIG. 3A and FIG. 3B are equally applied.

Referring to FIG. 4A and FIG. 4B, a circuit layer DP-CL according to an embodiment includes a buffer layer BFL, first to fifth insulating layers L10, L20, L30, L40, and L50, a transistor Ti, a connection electrode CNE, insulating patterns IP1, IP2-1, and IP2-2, and conductive patterns MP1, MP2, and MP3.

In a fourth area AR4, a (2-2)-th insulating pattern IP2-2 may be disposed on a first conductive pattern MP1. The (2-1)-th insulating pattern IP2-1 and the (2-2)-th insulating pattern IP2-2 may be in a same layer as each other. Specifically, the (2-2)-th insulating pattern IP2-2 may be disposed between the first conductive pattern MP1 and a first insulating pattern IP1.

The (2-2)-th insulating pattern IP2-2 is in contact with a first top surface TF1 of the first conductive pattern MP1 and exposes at least a portion of the first top surface TF1. A first opening OP1 of the fifth insulating layer L50 may overlap the exposed at least a portion of the first top surface TF1 and a portion of the (2-2)-th insulating pattern IP2-2.

A portion of the first insulating pattern IP1 which is in the first opening OP1 is disposed on an inner surface IF and a second top surface TF2 of the fifth insulating layer L50 and on the (2-2)-th insulating pattern IP2-2. Specifically, the first insulating pattern IP1 is in contact with the inner surface IF and the second top surface TF2 of the fifth insulating layer L50, and one end of the first insulating pattern IP1 is in contact with the (2-2)-th insulating pattern IP2-2.

A portion of the first top surface TF1 of the first conductive pattern MP1 does not overlap the first insulating pattern IP1 and the (2-2)-th insulating pattern IP2-2. Accordingly, the first top surface TF1 may be electrically connected to a circuit board, and the first conductive pattern MP1 may function as one of pads PD (see FIG. 2C).

Figure 5:
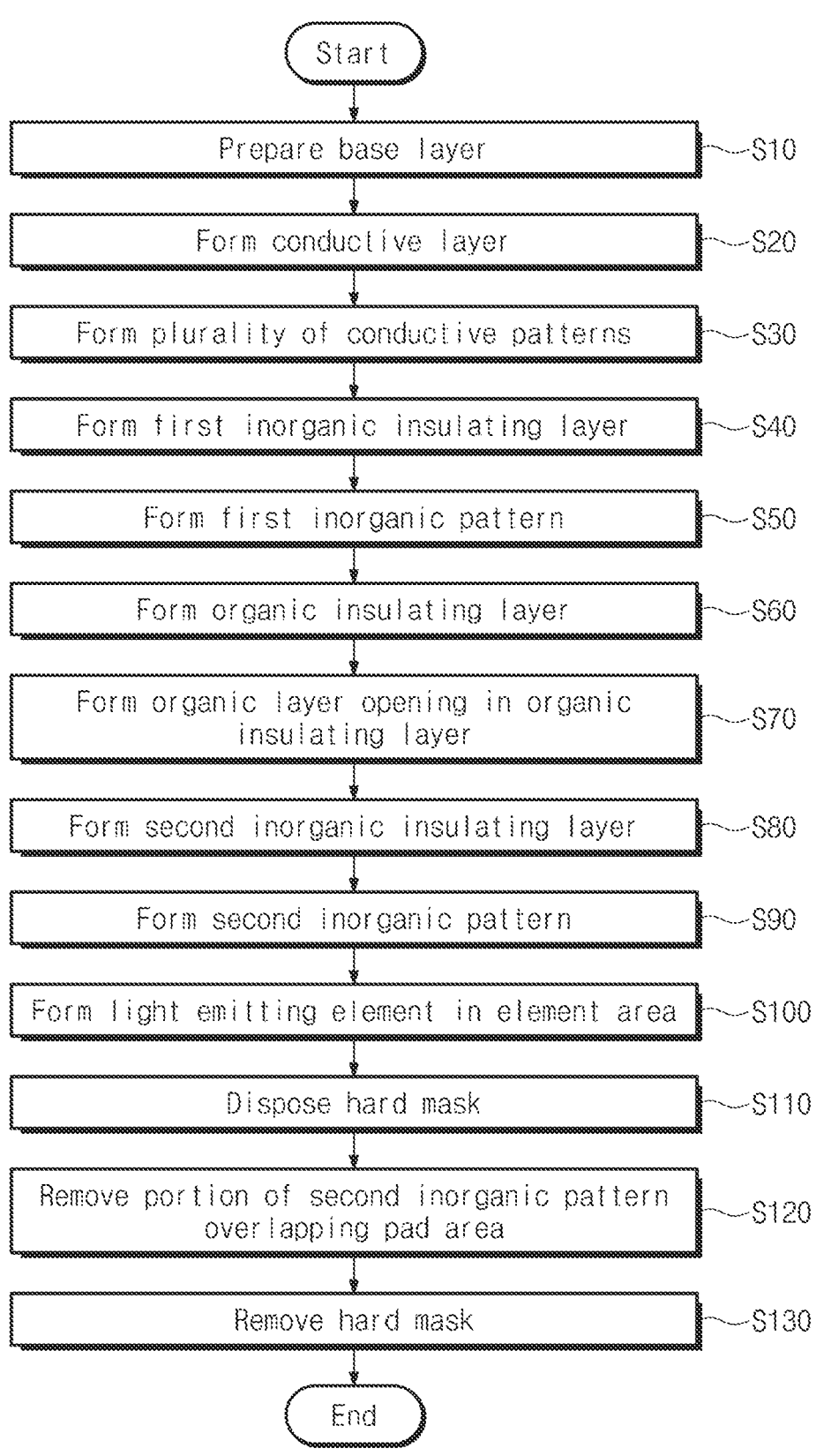
FIG. 5 is a flowchart of a method of manufacturing a display panel according to an embodiment.

FIG. 5 is a flowchart of a method of manufacturing (or providing) a display panel DP according to an embodiment of the invention.

Referring to FIG. 5, the method of manufacturing (or providing) a display panel DP according to an embodiment may include preparing a base layer BS (S10), forming (or providing) a conductive layer ML (S20), forming a plurality of conductive patterns MP1, MP2, and MP3 (S30), forming a first inorganic insulating layer (S40), forming a first inorganic pattern (S50), forming an organic insulating layer (S60), forming an organic layer opening in the organic insulating layer (S70), forming a second inorganic insulating layer (S80), forming a second inorganic pattern (S90), forming a light emitting element ED in an element area AR1 (S100), disposing a hard mask (S110), removing a portion of the second inorganic pattern overlapping a pad area AR4 (S120), and removing the hard mask (S130).

Figure 6A:
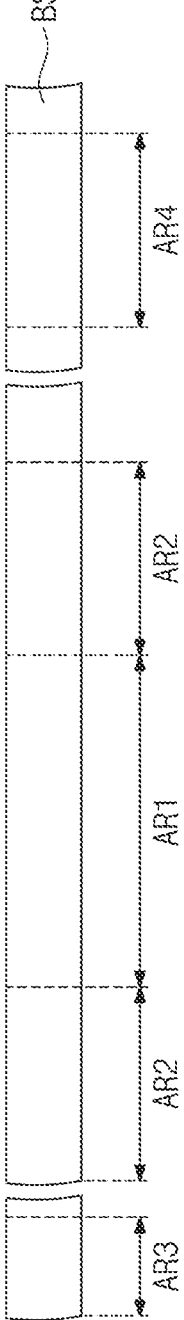
FIGS. 6A to 6N illustrate processes of a method of manufacturing a display panel according to an embodiment.

FIGS. 6A to 6N illustrate structures and processes in a method of manufacturing a display panel DP according to an embodiment of the invention.

Hereinafter, descriptions are given with reference to FIG. 5 and FIGS. 6A to 6N together, and detailed descriptions of components, among the components of FIG. 5 and FIGS. 6A to 6N, described above with reference to FIGS. 1A to 4B will not be given as the corresponding descriptions given above with reference to FIGS. 1A to 4B are equally applied.

Figure 6B:
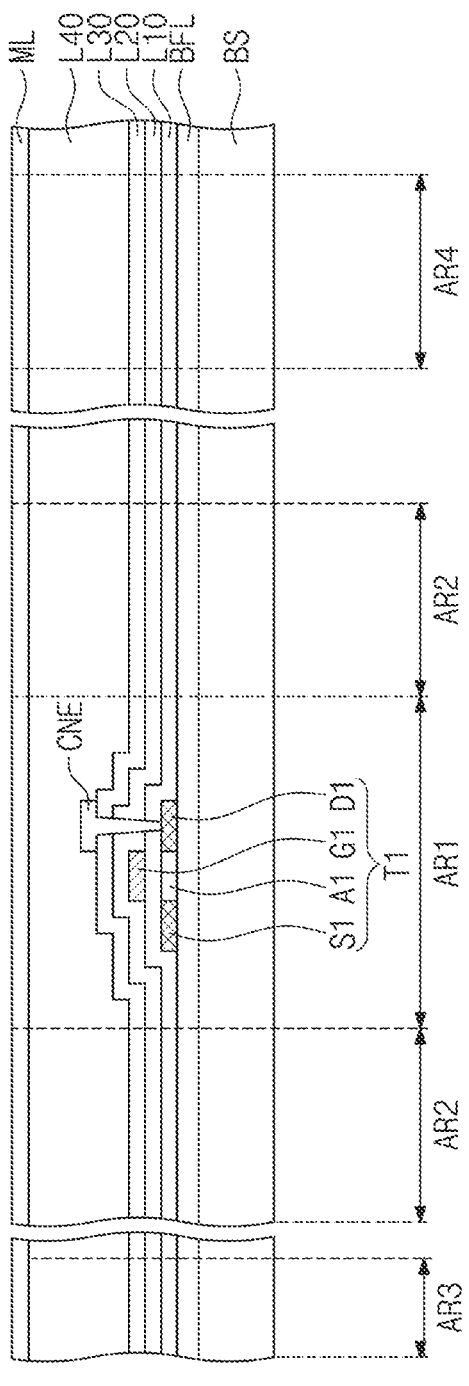

Referring to FIG. 6A and FIG. 6B, the preparing of the base layer BS (S10) according to an embodiment is preparing a base layer BS including a first area AR1, a second area AR2, a third area AR3, and a fourth area AR4.

After the preparing of the base layer BS (S10), forming (or providing) a buffer layer BFL, first to fifth insulating layers L10 to L50, a connection electrode CNE, and a transistor T1 on the base layer BS may be performed.

Thereafter, the forming of the conductive layer ML (S20) may be performed. The forming of the conductive layer ML (S20) according to an embodiment is forming a conductive layer ML (e.g., a first conductive layer) on the base layer BS. Specifically, the forming of the conductive layer ML (S20) may be forming the conductive layer ML on the fourth insulating layer L40 on the base layer BS.

The conductive layer ML may be formed to overlap the first to fourth areas AR1, AR2, AR3, and AR4. The conductive layer ML may have a single-layer structure or a multilayer structure. The conductive layer ML of the single-layer structure may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), and indium zinc tin oxide (IZTO). In addition, the transparent conductive layer may include a conductive polymer such as PEDOT, metal nanowires, graphene, and the like.

The conductive layer ML of the multilayer structure may include metal layers. The metal layers may have, for example, a three-layer structure of titanium/aluminum/titanium. The conductive layer of the multilayer structure may include at least one metal layer and at least one transparent conductive layer.

For example, the conductive layer ML of an embodiment of the invention may have a three-layer structure of titanium/aluminum/titanium. However, an embodiment is not limited thereto.

Figure 6C:
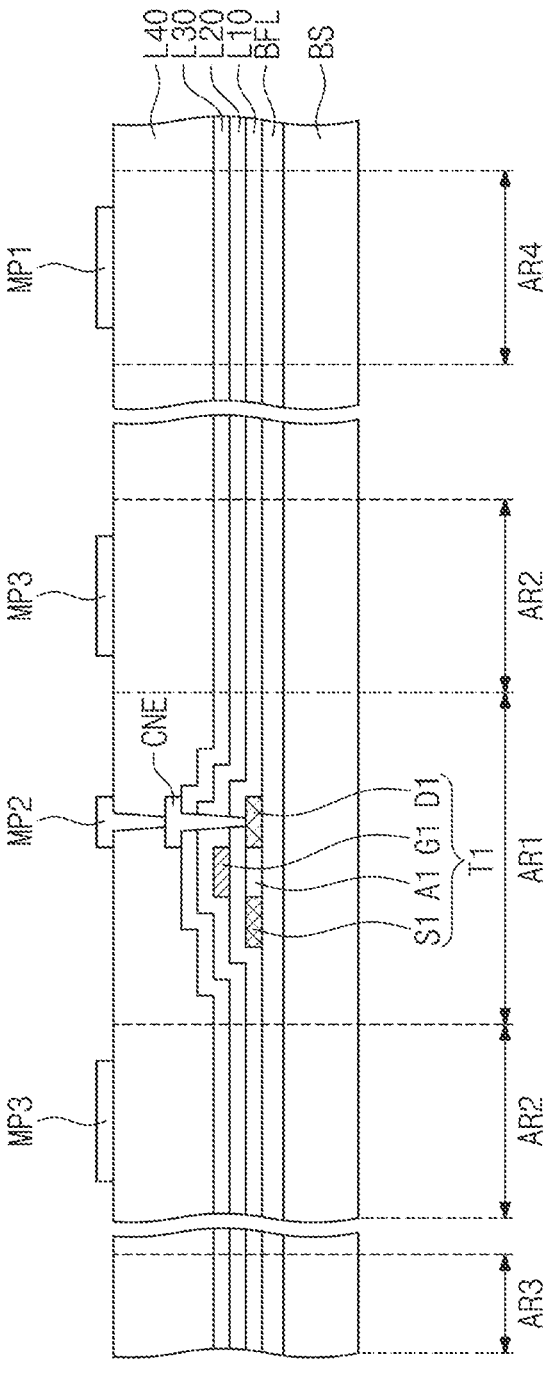

Referring to FIG. 6C, the forming of the plurality of conductive patterns MP1, MP2, and MP3 (S30) according to an embodiment may be forming a plurality of conductive patterns MP1, MP2, and MP3 by etching the conductive layer ML. That is, the conductive patterns MP1, MP2, and MP3 are respective patterns of a same material layer (e.g., the conductive layer ML). The plurality of conductive patterns MP1, MP2, and MP3 overlap the first area AR1, the second area AR2, and the fourth area AR4. Specifically, the plurality of conductive patterns MP1, MP2, and MP3 may include a first conductive pattern MP1 overlapping the fourth area AR4, a second conductive pattern MP2 overlapping the first area AR1, and each of third conductive patterns MP3 overlapping the second area AR2. Although one first conductive pattern MP1, one second conductive pattern MP2, and two third conductive patterns MP3 are illustrated as an example, the number of each of the first to third conductive patterns MP1, MP2, and MP3 is not limited thereto.

Figure 6D:
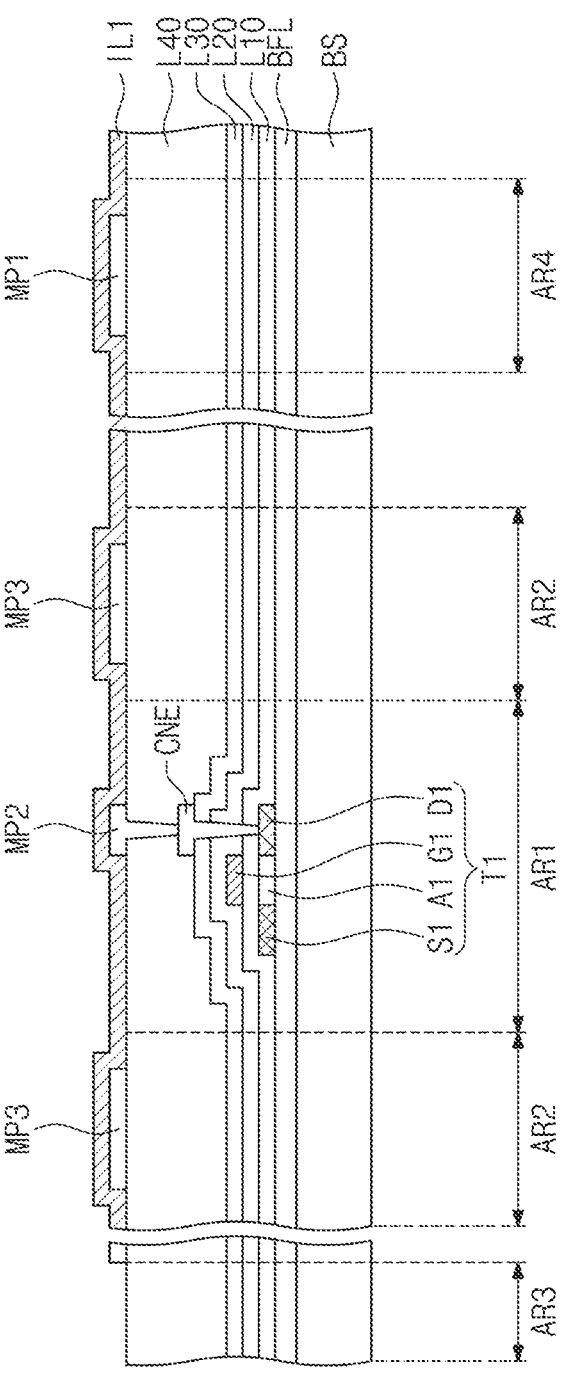

Referring to FIG. 6D, the forming of the first inorganic insulating layer (S40) according to an embodiment is forming a first inorganic insulating layer IL1 on the plurality of conductive patterns MP1, MP2, and MP3. The first inorganic insulating layer IL1 may be formed to be in contact with each of the plurality of conductive patterns MP1, MP2, and MP3. The first inorganic insulating layer IL1 may overlap the first area AR1, the second area AR2, and the fourth area AR4, and may not overlap the third area AR3.

Figure 6E:
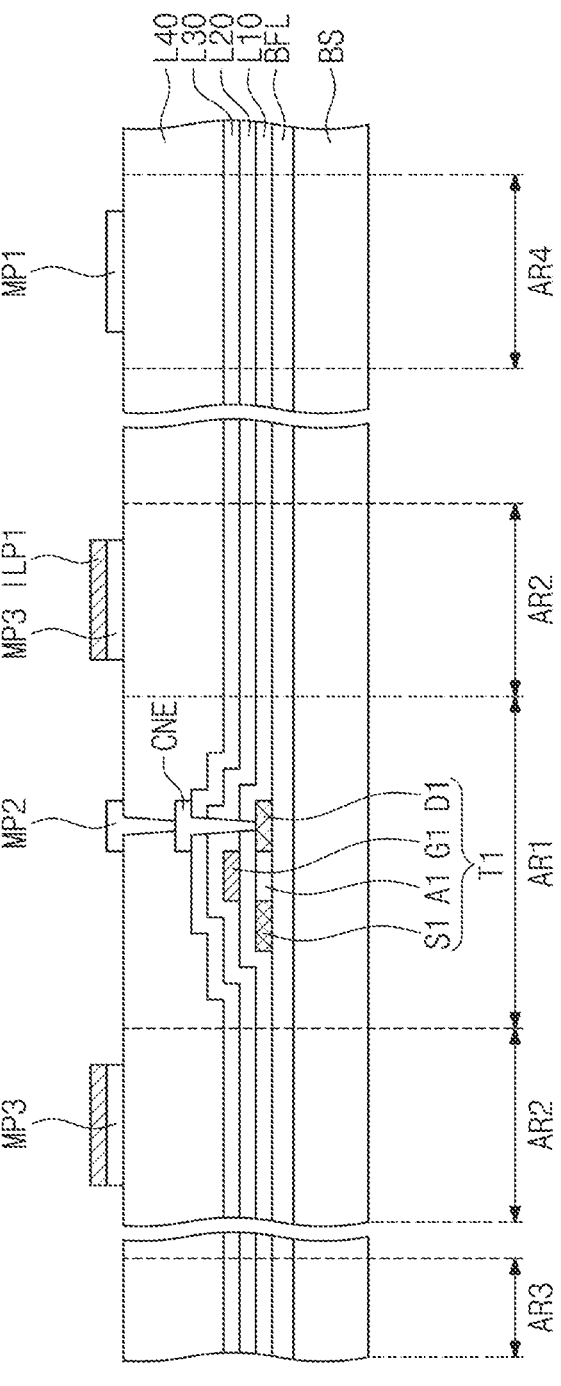

Referring to FIG. 6E, the forming of the first inorganic pattern (S50) according to an embodiment may be forming a first inorganic pattern ILP1 provided in plural including a plurality of first inorganic patterns, by etching the first inorganic insulating layer IL1. The first inorganic pattern ILP1 overlaps the second area AR2. Specifically, the first inorganic pattern ILP1 may be disposed on the third conductive pattern MP3 and may be in contact with a top surface of the third conductive pattern MP3.

The first inorganic pattern ILP1 does not overlap the first area AR1 and the third area AR3.

The first inorganic pattern ILP1 may correspond to the (2-1)-th insulating pattern IP2-1 described above with reference to FIG. 3A.

FIG. 6E illustrates an example in which the first inorganic pattern ILP1 does not overlap the fourth area AR4. However, an embodiment is not limited thereto, and in an embodiment of the invention, a first inorganic pattern ILP1 may overlap a fourth area AR4.

Figure 6F:
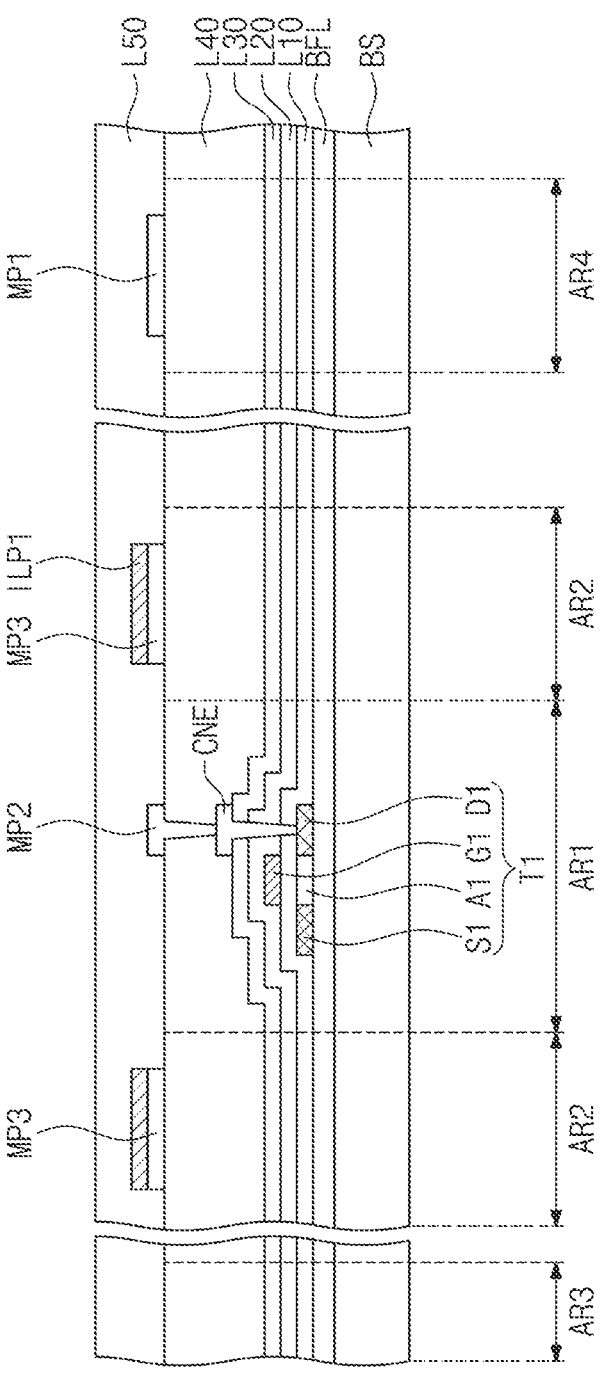

Referring to FIG. 6F, the forming of the organic insulating layer (S60) according to an embodiment is forming the organic insulating layer that covers the plurality of conductive patterns MP1, MP2, and MP3 and the first inorganic pattern ILP1. The organic insulating layer may be the aforementioned fifth insulating layer L50. The organic insulating layer L50 may be disposed on the fourth insulating layer L40 and may overlap the first to fourth areas AR1, AR2, AR3, and AR4.

The organic insulating layer L50 may cover the first conductive pattern MP1 and the second conductive pattern MP2 and cover a side surface of the third conductive pattern MP3 and a top surface of the first inorganic pattern ILP1.

Figure 6G:
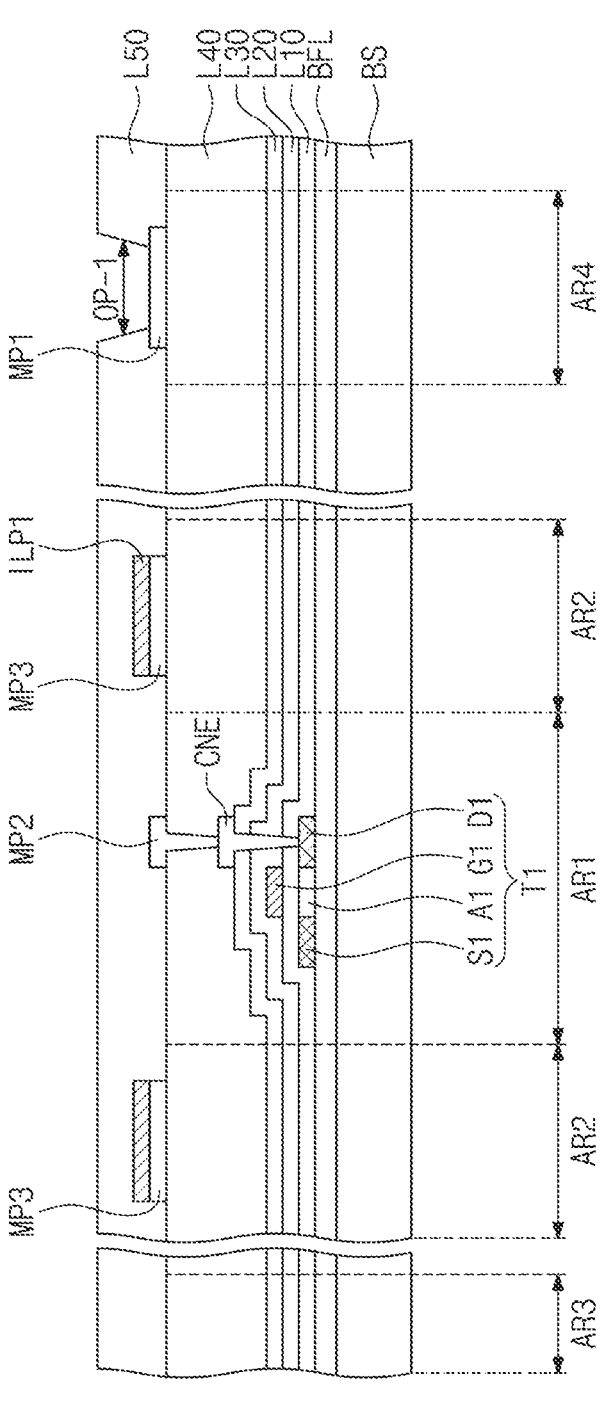

Referring to FIG. 6G, the forming of the organic layer opening in the organic insulating layer (S70) according to an embodiment is forming an organic layer opening OP-1 overlapping the fourth area AR4 in the organic insulating layer L50.

The organic layer opening OP-1 may expose a portion of a top surface of the first conductive pattern MP1.

Figure 6H:
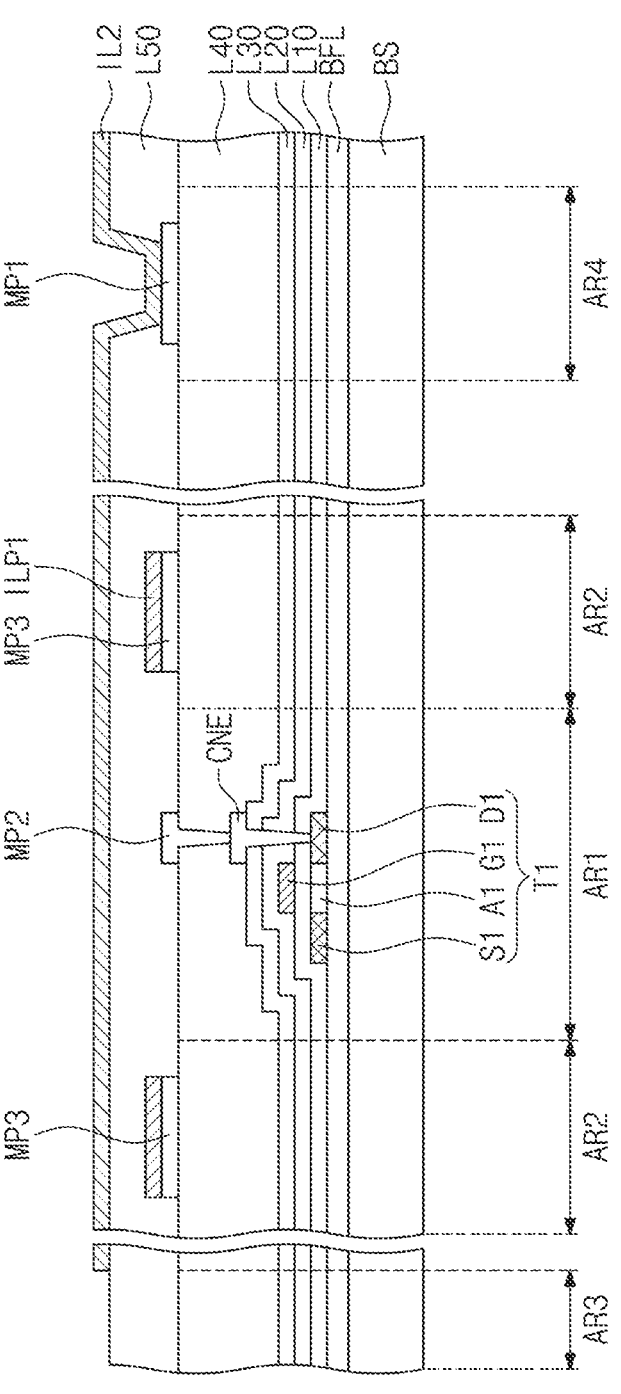
Figure 61:
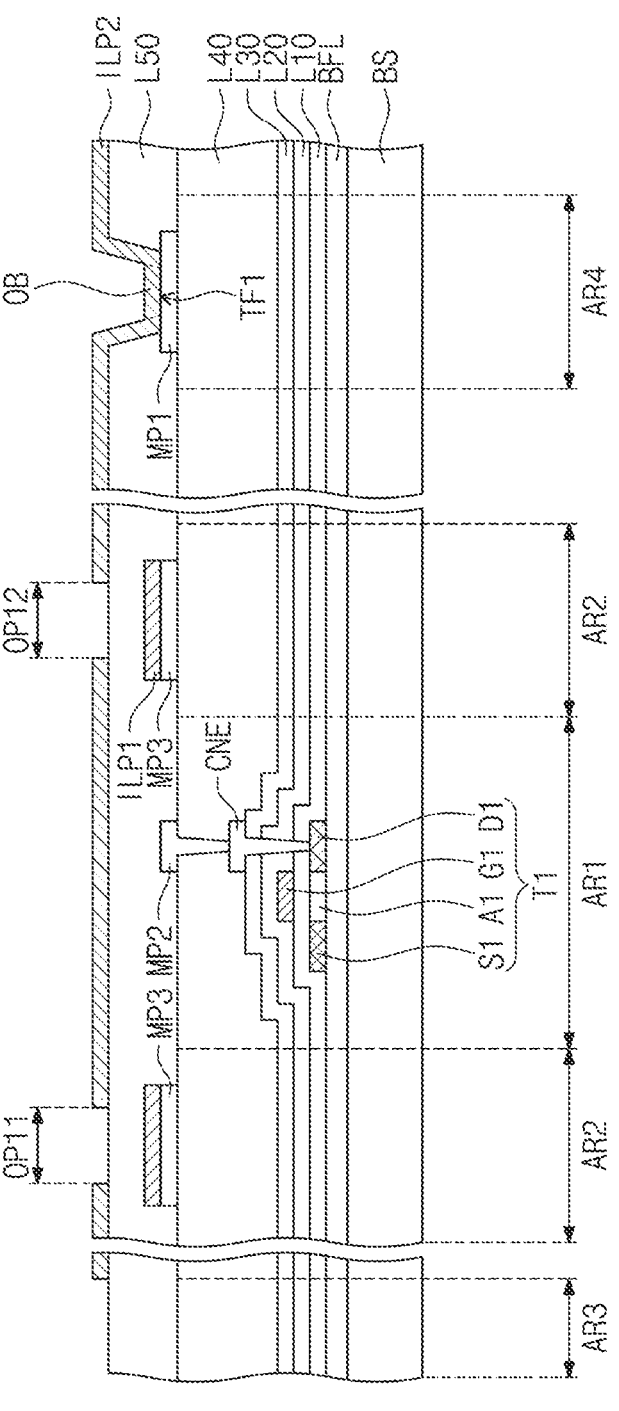

Referring to FIG. 6H, the forming of the second inorganic insulating layer (S80) according to an embodiment is forming a second inorganic insulating layer IL2 on the organic insulating layer L50. The second inorganic insulating layer IL2 may be in contact with a top surface of the organic insulating layer L50 and the portion of the top surface of the first conductive pattern MP1 exposed by the organic layer opening OP-1.

The second inorganic insulating layer IL2 may overlap the first area AR1, the second area AR2, and the fourth area AR4, and may not overlap the third area AR3.

Figure 6J:
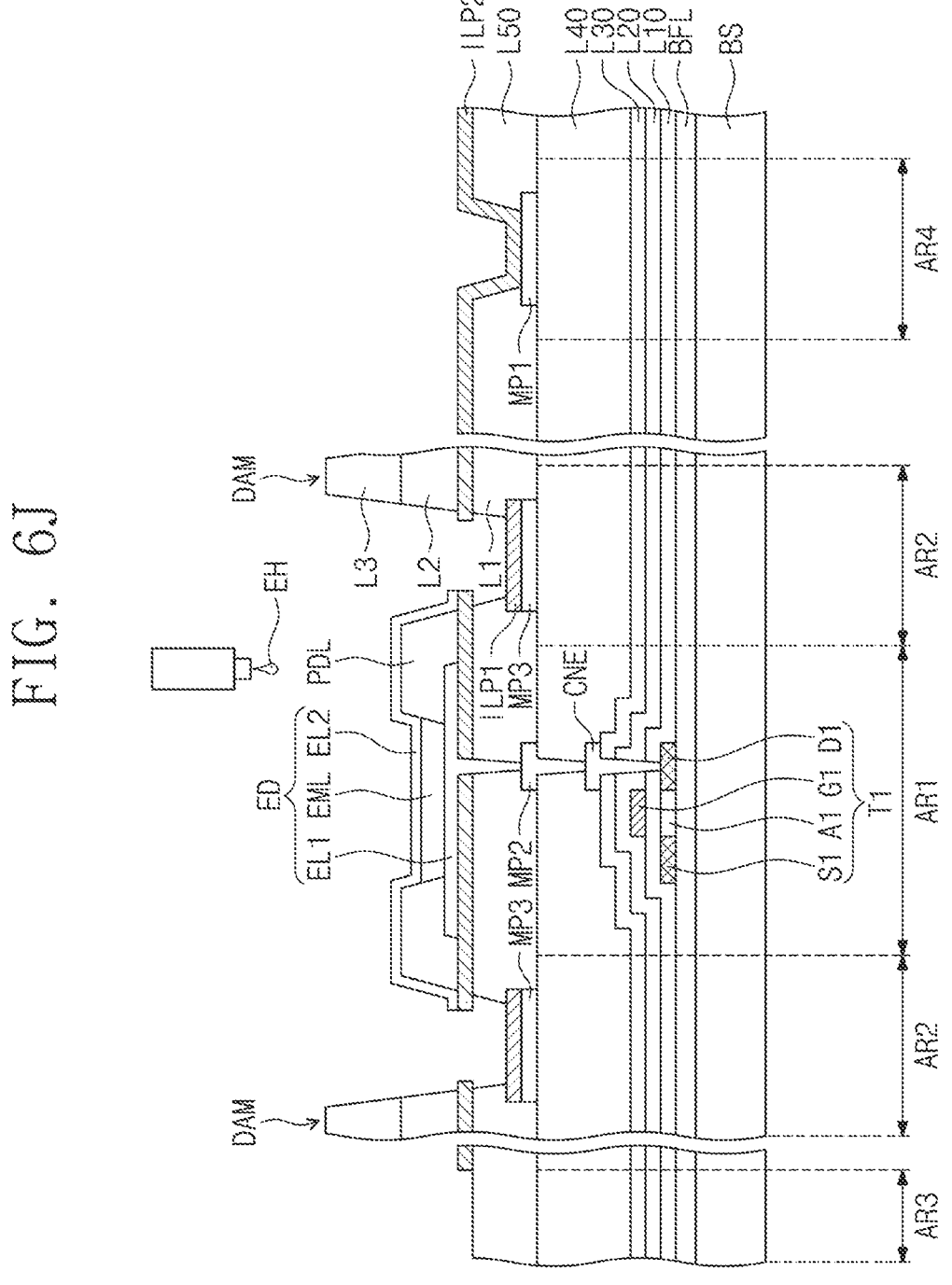

Referring to FIG. 6I and FIG. 6J together, the forming of the second inorganic pattern (S90) according to an embodiment may be forming a second inorganic pattern ILP2 provided in plural including a plurality of second inorganic patterns, by etching the second inorganic insulating layer IL2. The second inorganic pattern ILP2 entirely overlaps each of the first area AR1 and the fourth area AR4 (e.g., overlaps an entirety of the first area AR1 and the fourth area AR4). Specifically, the second inorganic pattern ILP2 entirely overlaps a portion of a first top surface TF1 of the first conductive pattern MP1 exposed by the organic layer opening OP-1 (see FIG. 6G). A portion of the second inorganic pattern ILP2 disposed on the portion of the first top surface TF1 of the first conductive pattern MP1 may be defined as a target portion OB. The target portion OB corresponds to an exposed portion of the first conductive pattern MP1 which provides an exposed surface of the pad PD.

The second inorganic pattern ILP2 includes inorganic layer openings OP11 and OP12 (e.g., insulating layer openings) overlapping the second area AR2. The second inorganic pattern ILP2 may not overlap a portion of the second area AR2. The second inorganic pattern ILP2 does not overlap the third area AR3 (e.g., is excluded from the third area AR3).

After the forming of the second inorganic pattern ILP2 (S90), etching portions of the organic insulating layer L50 respectively overlapping the inorganic layer openings OP11 and OP12 may be performed. Accordingly, the first inorganic pattern ILP1 may be exposed to outside the second inorganic pattern ILP2.

After the etching of the portions of the organic insulating layer L50 respectively overlapping the inorganic layer openings OP11 and OP12, forming a light emitting element ED in the first area AR1 (S100) may be performed.

The forming of the light emitting element ED in the first area AR1 (S100) may be forming a pixel defining film PDL and the light emitting element ED on a portion of the second inorganic pattern ILP2 disposed in the first area AR1. In the forming of the light emitting element ED in the first area AR1 (S100), dams DAM may be formed in the second area AR2. A first layer L1 of each of the dams DAM may be a portion of the organic insulating layer L50, and a second layer L2 thereof may be formed by the same process as the pixel defining film PDL. A third layer L3 of the dam may include an organic material. The dam may include one or more of the third layer L3 to secure a height of the dams DAM required by design.

In the process of forming the light emitting element ED and the pixel defining film PDL, a pixel etchant EH may be used. The pixel etchant EH according to an embodiment may include silver ions (Ag+).

The first conductive pattern MP1 of an embodiment may have a three-layer structure of titanium/aluminum/titanium, and when the silver ions (Ag+) of the pixel etchant EH and the aluminum of the first conductive pattern MP1 react, silver particles (Ag) may be formed. The silver particles disposed on the first conductive pattern MP1 may move to the light emitting element ED in a process such as etching and cleaning of the light emitting element ED and the pixel defining film PDL, and thus dark spot defects may be caused in a display area DA (see FIG. 2C).

In an embodiment of the invention, the first conductive pattern MP1 is covered by the second inorganic pattern ILP2, so that the first conductive pattern MP1 may be prevented from being exposed to the outside or damaged during the formation process of the light emitting element ED and the pixel defining film PDL. Accordingly, the method of manufacturing a display panel according to an embodiment of the invention may prevent silver particles from being formed through the reaction between the aluminum of the first conductive pattern MP1 and the silver ions (Ag+) of the pixel etchant EH, thereby preventing dark spot defects in a display device.

Figure 6K:
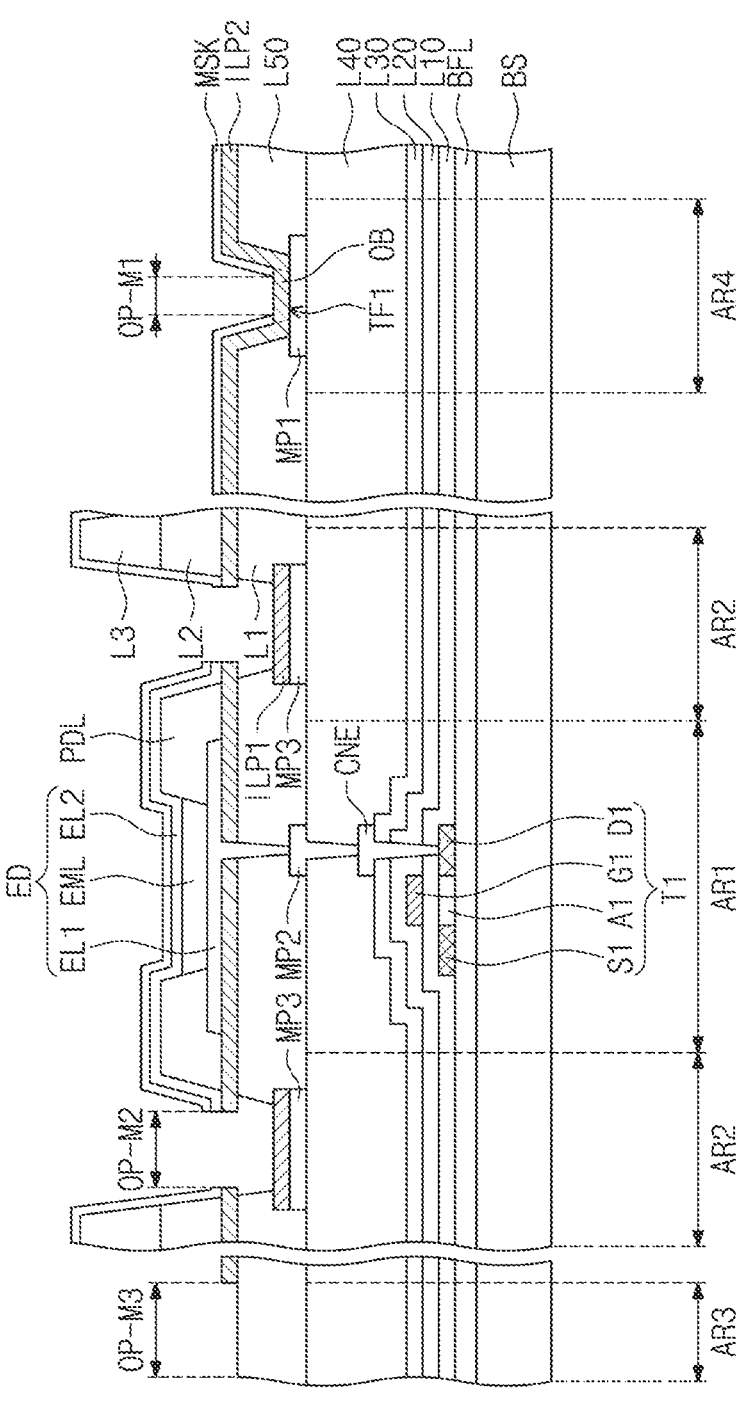

Referring to FIG. 6K, the disposing of a mask (S110) according to an embodiment is disposing a hard mask MSK that is disposed on the second inorganic pattern ILP2, includes a first mask opening OP-M1 overlapping the fourth area AR4, and includes transparent conductive oxide. The first mask opening OP-M1 corresponds to an exposed portion of the first conductive pattern MP1 which provides an exposed surface of the pad PD.

The hard mask MSK may include a conductive layer or a transparent conductive layer having a single-layer structure. The conductive layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), and indium zinc tin oxide (IZTO).

In addition, the transparent conductive layer may include a conductive polymer such as PEDOT, metal nanowires, graphene, and the like. For example, the hard mask MSK may include transparent conductive oxide, specifically, indium zinc oxide (IZO).

The hard mask MSK may be in contact with an upper portion of the second inorganic pattern ILP2. The hard mask MSK may include the first mask opening OP-M1 overlapping the fourth area AR4 and may further include second mask openings OP-M2 overlapping the second area AR2 and a third mask opening OP-M3 overlapping the third area AR3.

The first mask opening OP-M1 may overlap the target portion OB of the second inorganic pattern ILP2.

Figure 6L:
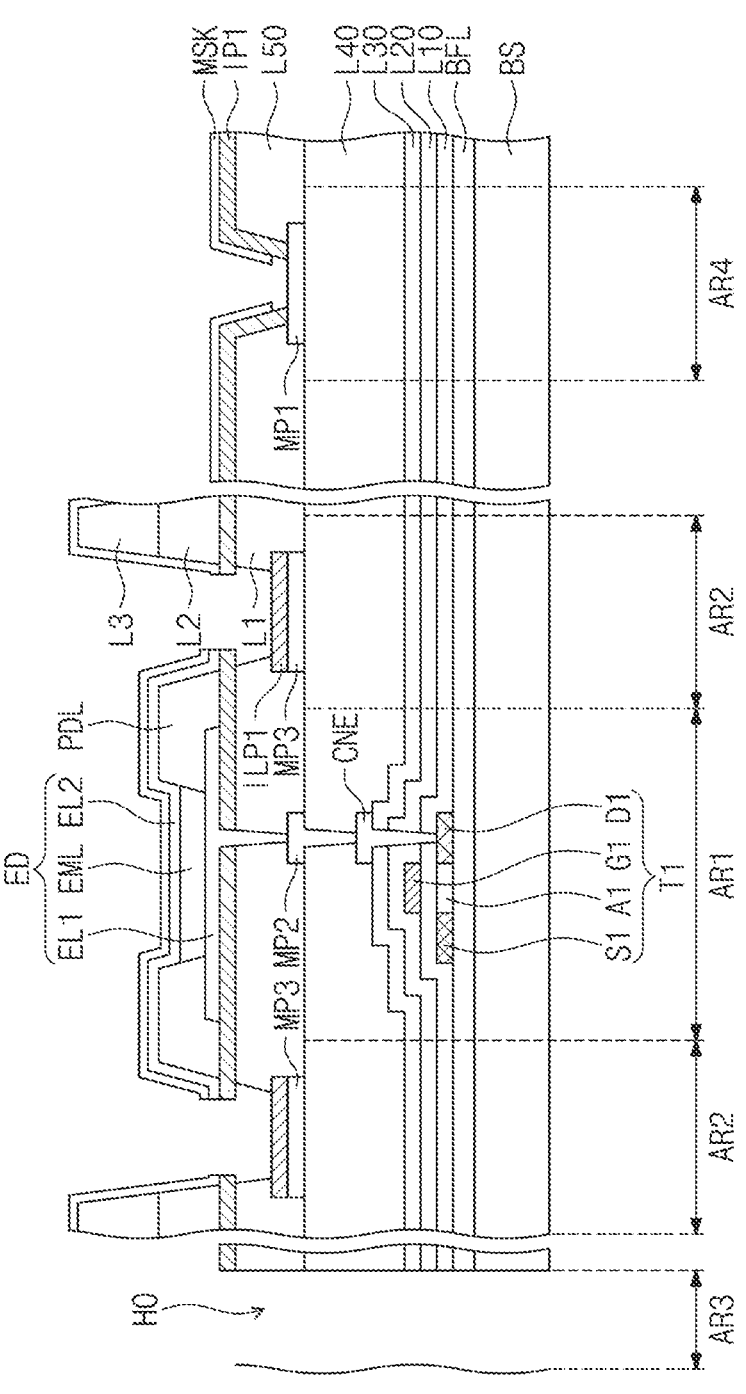

Referring to FIG. 6L, the removing of the portion of the second inorganic pattern ILP2 overlapping (or corresponding to) the pad area (S120) according to an embodiment is removing a portion of the second inorganic pattern ILP2 overlapping the fourth area AR4 by using the hard mask MSK. Specifically, the removing of the portion of the second inorganic pattern ILP2 overlapping the pad area (S120) may be removing the target portion OB (see FIG. 6I) of the second inorganic pattern ILP2. The target portion OB (see FIG. 6I) overlapping the first mask opening OP-M1 (see FIG. 6K) may be removed in an etching process.

A first insulating pattern IP1 may be formed by removing the target portion OB (see FIG. 6I) from the second inorganic pattern ILP2. The description of the first insulating pattern IP1 given above with reference to FIG. 3A may be equally applied to the first insulating pattern IP1 of FIG. 6L.

The removing of the portion of the second inorganic pattern ILP2 (S120) may include forming a through-hole HO in the third area AR3. The through-hole HO may be an opening penetrating a portion of each of the base layer BS, the buffer layer BFL, and the first to fifth insulating layers L10 to L50 disposed in the third area AR3. The through-hole HO may correspond to any one of the cut patterns PN illustrated in FIG. 2C.

Specifically, in the removing of the portion of the second inorganic pattern (S120), a first process of removing the target portion OB (see FIG. 6I) and a second process of removing the portion of each of the base layer BS, the buffer layer BFL, and the first to fifth insulating layers L10 to L50 disposed in the third area AR3 may be performed. The first and second processes may be performed simultaneously using a same one of the hard mask MSK. However, an embodiment is not limited thereto, and the first and second processes may be performed separately.

Figure 6M:
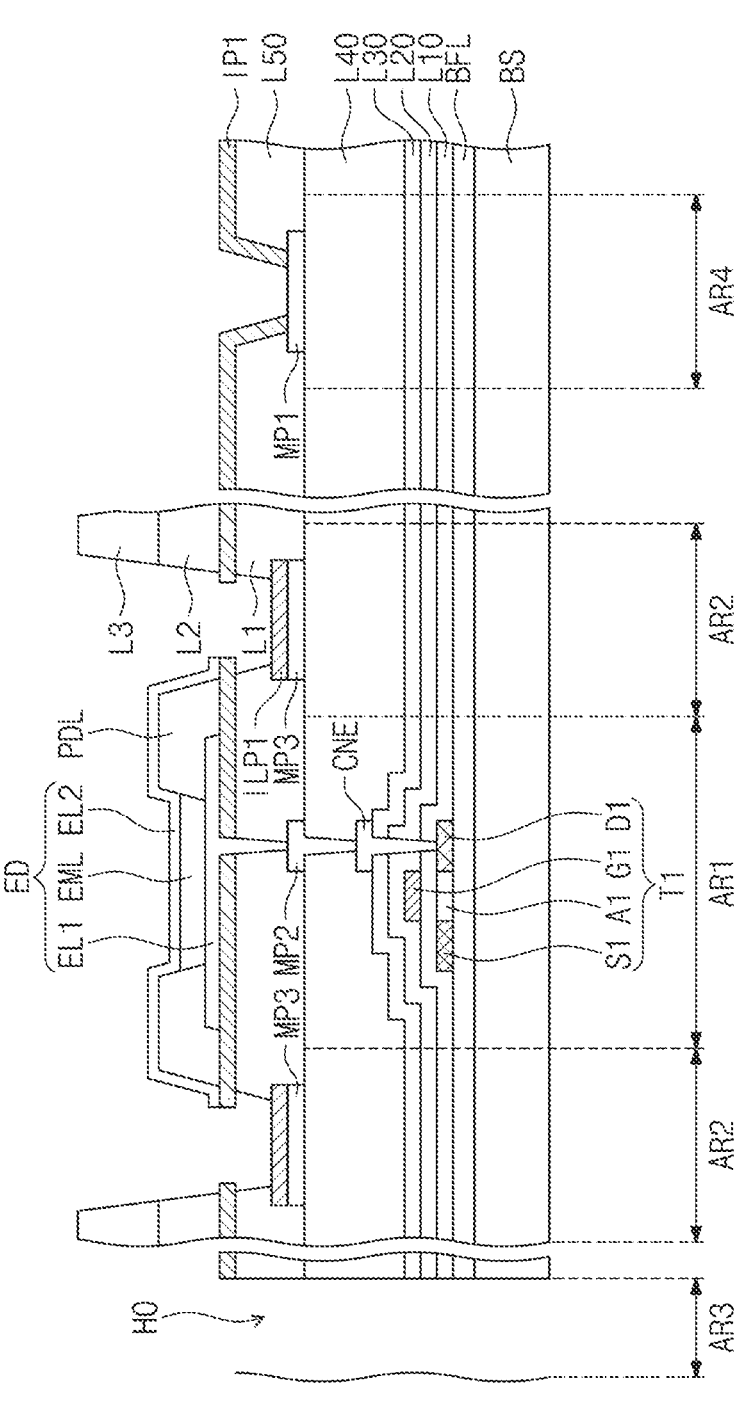
Figure 6N:
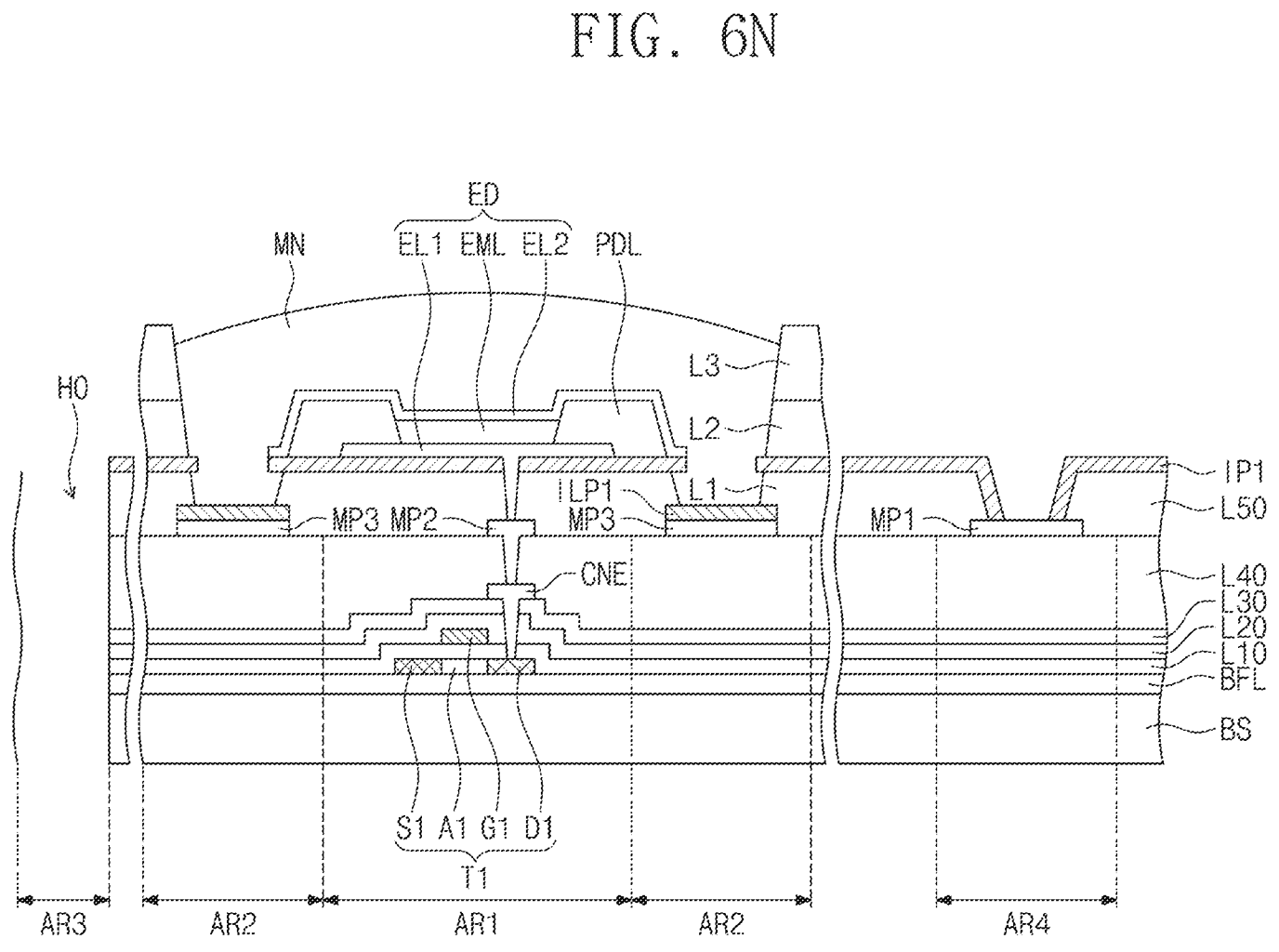

Referring to FIG. 6M, after the removing of the portion of the second inorganic pattern ILP2 (S120), the removing of the hard mask MSK (S130) may be performed. The hard mask MSK is used during the manufacturing process of the display panel DP and does not remain (e.g., is excluded) in the final product.

Referring to FIG. 6N, a process of forming a filler MN may be performed after the removing of the hard mask MSK (S130). The filler MN may overlap the first area AR1 and the second area AR2 and may cover the light emitting element ED. The filler MN may have a single-layer structure or a multilayer structure, and in the case of the multilayer structure, may include at least one of an organic layer or an inorganic layer.

Thereafter, a process of sealing the first to fourth areas AR1, AR2, AR3, and AR4 may be performed. That is, the filler MN is a sealing member at the element area AR1 which is at a corner of the display panel DP (e.g., a corner element area).

The display device DD according to an embodiment of the invention may include the first conductive pattern MP1 disposed in the fourth area AR4 of the display panel DP and include the first insulating pattern IP1 or the (2-2)-th insulating pattern IP2-2 in contact with the top surface of the first conductive pattern MP1.

In the method of manufacturing (or providing) a display panel DP according to an embodiment of the invention, the first conductive pattern MP1 is covered by the first insulating pattern IP1 during the etching process in providing of the light emitting element ED and the pixel defining film PDL, so that formation of silver particles (Ag) through the reaction between the pixel etchant EH and a material of the first conductive pattern MP1 is prevented. Accordingly, it is possible to prevent a problem that the silver particles move to the light emitting element ED to cause dark spot defects, and thus a display panel DP with improved display quality may be provided.

The display device DD according to an embodiment of the invention may have improved display quality.

The method of manufacturing (or providing) a display panel DP according to an embodiment of the invention may provide a display panel DP preventing dark spot defects.

Although the embodiments of the invention have been described herein, it is understood that various changes and modifications can be made by those skilled in the art within the spirit and scope of the invention defined by the following claims or the equivalents. Therefore, the embodiments described herein are not intended to limit the technical spirit and scope of the invention, and all technical spirit within the scope of the following claims or the equivalents will be construed as being included in the scope of the invention.

What is claimed is:

1. A display device comprising:
a display panel comprising:
    a display area;
    a non-display area which is adjacent to the display area and includes a pad area;
    a circuit layer in the display area and the pad area, the circuit layer including:
        a first conductive pattern which is in the pad area and includes a first top surface having a portion thereof exposed to outside of the display panel,
        an insulating layer on the first top surface of the first conductive pattern in the pad area and in which is defined an opening exposing the portion of the first top surface of the first conductive pattern to outside the insulating layer,
        the insulating layer including an inner surface which defines the opening and a second top surface which extends from the inner surface and extends along the first top surface of the first conductive pattern, and
        a first insulating pattern which is on the insulating layer, and extends along the inner surface of the insulating layer and into the opening which is defined in the insulating layer to be on the first top surface of the first conductive pattern; and
    a light emitting element layer including a light emitting element in the display area.

2. The display device of claim 1, wherein in the pad area, the first insulating pattern is in contact with the second top surface and the inner surface of the insulating layer.

3. The display device of claim 2, wherein in the pad area, the first insulating pattern is further in contact with the first top surface of the first conductive pattern.

4. The display device of claim 1, wherein the display area comprises:
an element area including the light emitting element of the light emitting element layer,
a groove area adjacent to the element area, and
the insulating layer which is in the display area and further defines a groove in the groove area.

5. The display device of claim 4, wherein the circuit layer further comprises:
a second conductive pattern which is in the element area and is in a same layer as the first conductive pattern in the pad area,
a third conductive pattern which is in the groove area and is in the same layer as the first conductive pattern in the pad area,
a (2-1)-th insulating pattern which is on the third conductive pattern, and
the insulating layer further on the second conductive pattern and the third conductive pattern in the display area, and the groove defined by the insulating layer exposing the (2-1)-th insulating pattern to outside the insulating layer.

6. The display device of claim 5, wherein within the groove which is defined by the insulating layer, the (2-1)-th insulating pattern is in contact with the third conductive pattern.

7. The display device of claim 5, wherein
the first insulating pattern is provided in plural including a plurality of first insulating patterns disconnected from each other at insulating layer openings, and
the insulating layer openings correspond to the opening in the pad area and the groove in the groove area.

8. The display device of claim 7, wherein
the first insulating pattern and the insulating layer together define a contact hole in the element area,
the light emitting element in the display area comprises a first electrode, a light emitting layer and a second electrode in order from the first insulating pattern, and
the first electrode is electrically connected to the second conductive pattern at the contact hole.

9. The display device of claim 1, wherein in the pad area,
the circuit layer further comprises a (2-2)-th insulating pattern which is between the first conductive pattern and the first insulating pattern, and in which is defined an opening, and
the opening defined in the (2-2)-th insulating pattern and the opening defined in the insulating layer together expose the top surface of the first conductive pattern to outside the display panel.

10. The display device of claim 1, wherein
the first insulating pattern comprises an inorganic material, and
the insulating layer comprises an organic material.

11. The display device of claim 1, further comprising:
a base layer comprising polyimide resin, and
the first conductive pattern, the insulating layer and the first insulating pattern in order from the base layer.

12. The display device of claim 1, further comprising a window facing the display area of the display panel,
wherein the window comprises:
a front area including a first side and a second side which meets the first side at a corner of the front area,
    a first side area which is bent from the first side of the front area and has a first curvature,
    a second side area which is bent from the second side of the front area and has a second curvature, and a corner area which corresponds to the corner of the front area and extends between the first side area and the second side area.

* * * * *